(12) United States Patent
Guo et al.

(10) Patent No.: US 11,710,533 B2
(45) Date of Patent: *Jul. 25, 2023

(54) NAND FLASH ARRAY DEFECT REAL TIME DETECTION

(71) Applicant: Micron Technology, Inc., Boise, ID (US)

(72) Inventors: Xiaojiang Guo, San Jose, CA (US); Jung Sheng Hoei, Newark, CA (US); Michele Piccardi, Cupertino, CA (US); Manan Tripathi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/874,501

(22) Filed: Jul. 27, 2022

(65) Prior Publication Data

US 2022/0367000 A1    Nov. 17, 2022

Related U.S. Application Data

(63) Continuation of application No. 16/887,516, filed on May 29, 2020, now Pat. No. 11,437,117.

(51) Int. Cl.
*G11C 29/50* (2006.01)
*G11C 16/04* (2006.01)
(Continued)

(52) U.S. Cl.
CPC .... *G11C 29/50004* (2013.01); *G11C 16/0483* (2013.01); *G11C 16/08* (2013.01);
(Continued)

(58) Field of Classification Search
None
See application file for complete search history.

(56) References Cited

U.S. PATENT DOCUMENTS 10,388,399 B2    8/2019    Kwon et al.
11,437,117 B2 *  9/2022    Guo .................. G11C 16/08
(Continued)

FOREIGN PATENT DOCUMENTS

CN    113744790 A    12/2021
CN    113744794 A    12/2021

OTHER PUBLICATIONS

U.S. Appl. No. 16/887,516, filed May 29, 2020, NAND Flash Array Defect Real Time Detection.
(Continued)

*Primary Examiner* — Guerrier Merant
(74) *Attorney, Agent, or Firm* — Schwegman Lundberg & Woessner, P.A.

(57) ABSTRACT

A memory device comprises a memory array; a word line driver circuit including a charge pump circuit configured to generate a program voltage target to be applied to a word line to program a memory cell of the memory array, and a control loop to activate the charge pump circuit using a control signal according to a comparison of a pump circuit output voltage to a specified duty cycle after the charge pump circuit output reaches the program voltage target, and provides an indication of current generated by the charge pump circuit according to the duty cycle; and logic circuitry that generates a fault indication when the current generated by the charge pump circuit is greater than a specified threshold current.

18 Claims, 19 Drawing Sheets

(51) Int. Cl.
    *G11C 16/08*     (2006.01)
    *G11C 16/34*     (2006.01)
    *G11C 16/10*     (2006.01)

(52) U.S. Cl.
    CPC .......... *G11C 16/10* (2013.01); *G11C 16/3459* (2013.01); *G11C 2029/5004* (2013.01); *G11C 2029/5006* (2013.01)

(56) References Cited

U.S. PATENT DOCUMENTS

| | | |
|---|---|---|
| 11,482,298 B2 | 10/2022 | Nevill et al. |
| 2004/0039535 A1 | 2/2004 | Barth et al. |
| 2005/0128821 A1 | 6/2005 | Kim et al. |
| 2008/0031078 A1 | 2/2008 | Kang |
| 2012/0134228 A1 | 5/2012 | Yu et al. |
| 2018/0358109 A1 | 12/2018 | Kwon et al. |
| 2019/0392908 A1 | 12/2019 | Lee et al. |
| 2020/0005886 A1 | 1/2020 | Lee |
| 2021/0119531 A1 | 4/2021 | Chou et al. |
| 2021/0375386 A1 | 12/2021 | Guo et al. |
| 2021/0375387 A1 | 12/2021 | Nevill et al. |

OTHER PUBLICATIONS

U.S. Appl. No. 16/887,592, filed May 29, 2020, Device Field Degradation and Factory Defect Detection by Pump Clock Monitoring.

"Korean Application Serial No. 10-2021-0067668, Notice of Preliminary Rejection dated Jul. 5, 22", w English translation, 23 pgs.

"Korean Application Serial No. 10-2021-0067668, Response filed Sep. 5, 2022 to Notice of Preliminary Rejection dated Jul. 5, 2022", w/ English Claims, 27 pgs.

"Korean Application Serial No. 10-2021-0068325, Notice of Preliminary Rejection dated Oct. 31, 2022", w/o English translation, 11 pgs.

\* cited by examiner

NAND FLASH ARRAY DEFECT REAL TIME DETECTION

PRIORITY APPLICATION

This application is a continuation of U.S. application Ser. No. 16/887,516, filed May 29, 2020, which is incorporated herein by reference in its entirety.

Embodiments of the disclosure relate to managed memory devices, and more specifically relate to a memory device that can provide multiple configurations to address multiple competing requirements of a memory system.

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMCT™), etc., as discussed further below.

Defects can occur in memory arrays. These defects can include shorts of the word lines and the bit lines. Sometimes these defects are undetectable at the time the devices complete manufacture or the defects are not present at the time of manufacture and occur sometime during the operating life of the memory array. There would be a benefit from improvement in testing for defects in the memory systems.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
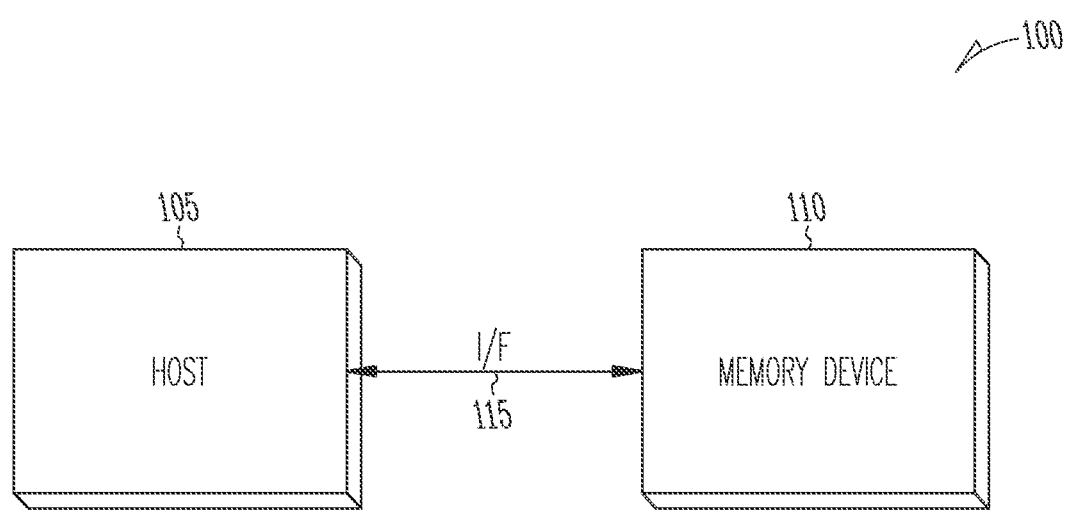
FIG. 1 illustrates an example system including a host and a memory device according to some examples described herein.

Memory devices can include arrays of memory cells. Managed memory devices can include a memory control unit to control or manage access to the memory arrays according to multiple memory management protocols. These protocols may be implemented in firmware installed in the memory control unit and can be performed using processing circuitry. Many of the protocols can be interlinked so that changing one protocol has an effect on one or more other protocols. Changing or limiting any one protocol will have an impact on other factors and system behaviors. A conventional approach is to develop a specific memory system for a specific implementation. A better approach is a memory management protocol that self-adjusts according to the implementation. The self-adjusting may be in response to detected operating conditions of the memory system.

Memory devices include individual memory die, which may, for example, include including a storage region comprising one or more arrays of memory cells, implementing one (or more) selected storage technologies. Such memory die will often include support circuitry for operating the memory array(s). Other examples, sometimes known generally as "managed memory devices," include assemblies of one or more memory die associated with controller functionality configured to control operation of the one or more memory die. Such controller functionality can simplify interoperability with an external device, as a "host" device as discussed later herein. In such managed memory devices, the controller functionality may be implemented on one or more die also incorporating a memory array, or on a separate die. In other examples, one or more memory devices may be combined with controller functionality to form a solid-stage drive (SSD) storage volume.

Embodiments of the present disclosure are described in the example of managed memory devices implementing NAND flash memory cells. These examples, however, are not limiting on the scope of the disclosure, which may be implemented in other forms of memory devices and/or with other forms of storage technology.

Both NOR and NAND flash architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell(s) that can store more than one bit of data per cell (i.e., that can represent more than two programmed states).

Managed memory devices may be configured and operated in accordance with recognized industry standards. For example, managed NAND devices may be (as non-limiting examples), a Universal Flash Storage (UFS™) device, or an embedded MMC device (eMMC™), etc. For example, in the case of the above examples, UFS devices may be configured in accordance with Joint Electron Device Engineering Council (JEDEC) standards (e.g., JEDEC standard JESD223D, entitled JEDEC UFS Flash Storage 3.0, etc., and/or updates or subsequent versions to such standard. Similarly, identified eMMC devices may be configured in accordance with JEDEC standard JESD84-A51, entitled "JEDEC eMMC standard 5.1", again, and/or updates or subsequent versions to such standard.

An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact. Managed memory devices, for example managed NAND devices, can be used as primary or ancillary memory in various forms of electronic devices, and are commonly used in mobile devices.

Both SSDs and managed memory devices can include a number of memory devices, including a number of dies or logical units (e.g., logical unit numbers or LUNs), and can include one or more processors or other controllers performing logic functions required to operate the memory devices or interface with external systems. Such SSDs and managed memory devices can include one or more flash memory die, including a number of memory arrays and peripheral circuitry thereon. The flash memory arrays can include a number of blocks of memory cells organized into a number of physical pages. In some examples, the SSDs can also include DRAM or SRAM (or other forms of memory die or other memory structures). Similarly, managed NAND devices can include one or more arrays of volatile and/or nonvolatile memory separate from the NAND storage array, and either within or separate from a controller. Both SSDs and managed NAND devices can receive commands from a host in association with memory operations, such as read or write operations to transfer data (e.g., user data and associated integrity data, such as error data and address data, etc.) between the memory devices and the host, or erase operations to erase data from the memory devices.

FIG. 1 illustrates an example system 100 including a host 105 and a memory device 110. The host 105 can include a host processor, a central processing unit, or one or more other device, processor, or controller. The memory device 110 can include one or more other memory devices, or the communication interface 115 can include one or more other interfaces, depending on the host 105 and the memory device 110.

Each of the host 105 and the memory device 110 can include a number of receiver or driver circuits configured to send or receive signals over the communication interface 115, or interface circuits, such as data control units, sampling circuits, or other intermedia circuits configured to process data to be communicated over, or otherwise process data received from the communication interface 115 for use by the host 105, the memory device 110, or one or more other circuits or devices.

The memory device 110 can include a memory array (e.g., one or more arrays of memory cells, such as a NAND flash memory array, or one or more other memory arrays), a memory control unit, and in certain examples, an interface circuit between the memory array and the memory control unit. In certain examples, the memory device can include a number of memory die, each having control logic separate from the memory control unit. The memory control unit can include an application specific integrated circuit (ASIC), a field programmable gate array (FPGA), or one or more other processing circuits arranged or programmed to manage data transfers or operations to, from, or within the memory array.

Figure 2:
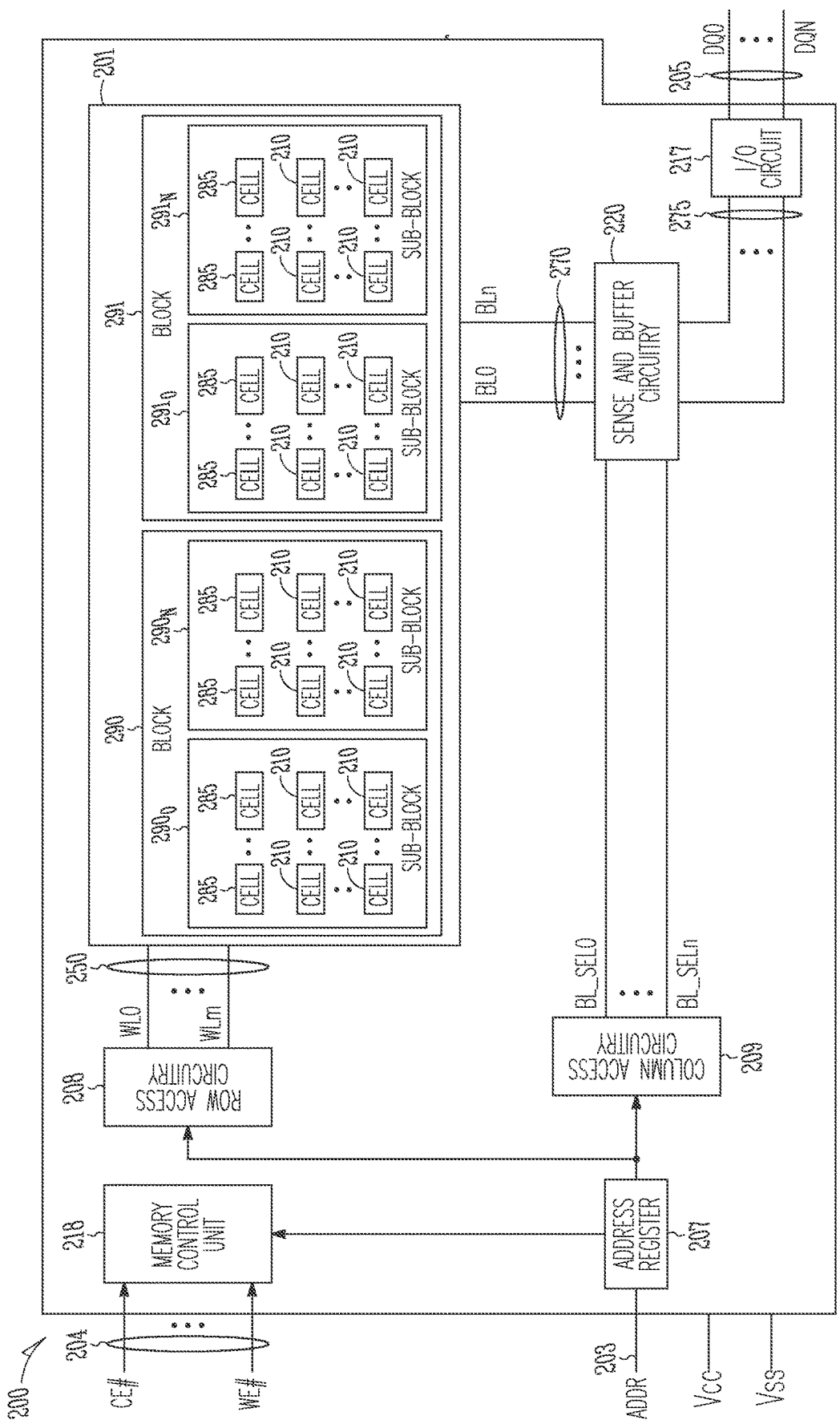
FIG. 2 is a block diagram of an apparatus in the form of a memory device including non-volatile memory cells according to some examples described herein.

FIG. 2 shows a block diagram of an example memory device 200 suitable for use as memory device 110 in FIG. 1.

The memory device can include non-volatile memory cells having mixed memory cell types integrated in the same integrated circuit (IC) chip, according to some examples described herein. Memory device 200 can include a memory array (or multiple memory arrays) 201 containing memory cells 210 and 285. In the physical structure of memory device 200, memory cells 210 and 285 can be arranged vertically (e.g., stacked over each other) over a substrate of memory device 200 (e.g., a semiconductor substrate of an IC chip that includes memory device 200). Memory cells 210 and 285 can include non-volatile cells. Memory cells 210 and 285 can have different non-volatile memory cell types. For example, memory cells 210 can include floating gate memory cells, charge trap memory cells, or other types of non-volatile memory cells. Memory cells 285 can include ferroelectric memory cells, phase change memory cells, resistive memory cells, conduction bridge memory cells, and spin-transfer-torque magnetic random access memory (STT-MRAM) cells, or other types of non-volatile memory cells.

As shown in FIG. 2, memory cells 210 and 285 can be arranged in blocks (memory cell blocks), such as blocks 290 and 291. Each of blocks 290 and 291 can include sub-blocks. For example, block 290 can include sub-blocks $290_0$ and $290_n$, and block 291 can include sub-blocks $291_0$ and $291_n$. Each of sub-blocks $290_0$, $290_n$, $291_0$, and $291_n$ can include a combination of memory cells 210 and 285. FIG. 2 shows memory device 200 having two blocks 290 and 291 and two sub-blocks in each of the blocks as an example. Memory device 200 can have more than two blocks and more than two sub-blocks in each of the blocks.

The memory cells can be included in memory planes. Different portions of a memory die can be referred to as different planes or plane groups (e.g., a group of two or more planes can constitute a plane group) of a same die. In an illustrative example intended to be non-limiting a memory device may include four memory dies with each die having two planes for a total of eight planes. Commands to the different planes of the same die may execute simultaneously. The memory cells 210 and 285 can be arranged in, for example, a number of devices, semi-conductor dies, planes, sub-blocks, blocks, or pages. More than one plane, sub-block, block, or page can be included on one memory die.

As shown in FIG. 2, memory device 200 can include access lines (which can include word lines) 250 and data lines (which can include bit lines) 270. Access lines 250 can carry signals (e.g., word line signals) WL0 through WLm. Data lines 270 can carry signals (e.g., bit line signals) BL0 through BLn. Memory device 200 can use access lines 250 to selectively access sub-blocks $290_0$, $290_n$, $291_0$, and $291_n$ of blocks 290 and 291 and data lines 270 to selectively exchange information (e.g., data) with memory cells 210 of blocks 290 and 291.

Memory device 200 can include an address register 207 to receive address information (e.g., address signals) ADDR on lines (e.g., address lines) 203. Memory device 200 can include row access circuitry 208 and column access circuitry 209 that can decode address information from address register 207. Based on decoded address information, memory device 200 can determine which memory cells 210 of which sub-blocks of blocks 290 and 291 are to be accessed during a memory operation. Memory device 200 can perform a read operation to read (e.g., sense) information (e.g., previously stored information) in memory cells 210, or a write (e.g., program) operation to store (e.g., program) information in memory cells 210. Memory device 200 can use data lines 270 associated with signals BL0 through BLn to provide information to be stored in memory cells 210 or obtain information read (e.g., sensed) from memory cells 210. Memory device 200 can also perform an erase operation to erase information from some or all of memory cells 210 of blocks 290 and 291.

Memory device 200 can include a memory control unit 218 or internal memory controller (which can include processing circuitry components such as processor 219, a state machine (e.g., finite state machine), register circuits, and other components) configured to control memory operations (e.g., read, write, and erase operations) of memory device 200 based on control signals on lines 204. Examples of the control signals on lines 204 include one or more clock signals and other signals (e.g., a chip enable signal CE #, a write enable signal WE #) to indicate which operation (e.g., read, write, erase operation, erase-verify operation) memory device 200 can perform. The memory control unit 218 can be included in the same integrated circuit chip as the memory cells. In some examples, the memory cells are NAND memory cells included in an integrated circuit die and the memory control unit 218 is included in the same integrated circuit die as the NAND memory cells.

Memory device 200 can include sense and buffer circuitry 220 that can include components such as sense amplifiers and page buffer circuits (e.g., data latches). Sense and buffer circuitry 220 can respond to signals BL_SEL0 through BL_SELn from column access circuitry 209. Sense and buffer circuitry 220 can be configured to determine (e.g., by sensing) the value of information read from memory cells 210 (e.g., during a read operation) of blocks 290 and 291 and provide the value of the information to lines (e.g., global data lines) 275. Sense and buffer circuitry 220 can also can be configured to use signals on lines 275 to determine the value of information to be stored (e.g., programmed) in memory cells 210 of blocks 290 and 291 (e.g., during a write operation) based on the values (e.g., voltage values) of signals on lines 275 (e.g., during a write operation).

Memory device 200 can include input/output (I/O) circuitry 217 to exchange information between memory cells 210 of blocks 290 and 291 and lines (e.g., I/O lines) 205. Signals DQ0 through DQN on lines 205 can represent information read from or stored in memory cells 210 of blocks 290 and 291. Lines 205 can include nodes within memory device 200 or pins (or solder balls) on a package where memory device 200 can reside. Other devices external to memory device 200 (e.g., an external memory controller, or a processor) can communicate with memory device 200 through lines 203, 204, and 205.

Memory device 200 can receive a supply voltage, including supply voltages Vcc and Vss. Supply voltage Vss can operate at a ground potential (e.g., having a value of approximately zero volts). Supply voltage Vcc can include an external voltage supplied to memory device 200 from an external power source such as a battery or alternating current to direct current (AC-DC) converter circuitry.

Each of memory cells 210 can be programmed individually or collectively to one or a number of programmed states. For example, a single-level cell (SLC) can represent one of two programmed states (e.g., 1 or 0), representing one bit of data. However, flash memory cells can also be multi-level cells (MLCs) that represent one of more than two programmed states, allowing the manufacture of higher density memories without increasing the number of memory cells, as each cell can represent more than one binary digit (e.g., more than one bit).

In another example, each of memory cells 210 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell). MLC is used herein in its broader context, to refer to any memory cell that can store more than one bit of data per cell (i.e., that can represent more than two programmed states, including a triple-level cell (TLC) can refer to a memory cell that can store three bits of data per cell (e.g., one of eight programmed states), and a quad-level cell (QLC) can store four bits of data per cell).

Memory device 200 can include a non-volatile memory device, such that memory cells 210 and 285 can retain information stored thereon when power (e.g., voltage Vcc, Vss, or both) is disconnected from memory device 200. For example, memory device 200 can be a flash memory device, such as a NAND flash (e.g., 3-dimensional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 200 may include other components not shown in FIG. 2 so as not to obscure the example embodiments described herein.

Memory devices may experience deterioration as a function of time and use. One type of defect that can occur in memory devices is an access line or a word line short. Other types of shorts can also occur (e.g., a short in a bit line). The short may be present when the device is fabricated or may develop during the lifetime of the memory devices. The short may develop after manufacturing due to continuous stress during operation of the memory array. A word line short can cause failure of a program, read or other operation in one or more memory planes of the device, or specifically in the memory plane having the short.

Figure 3:
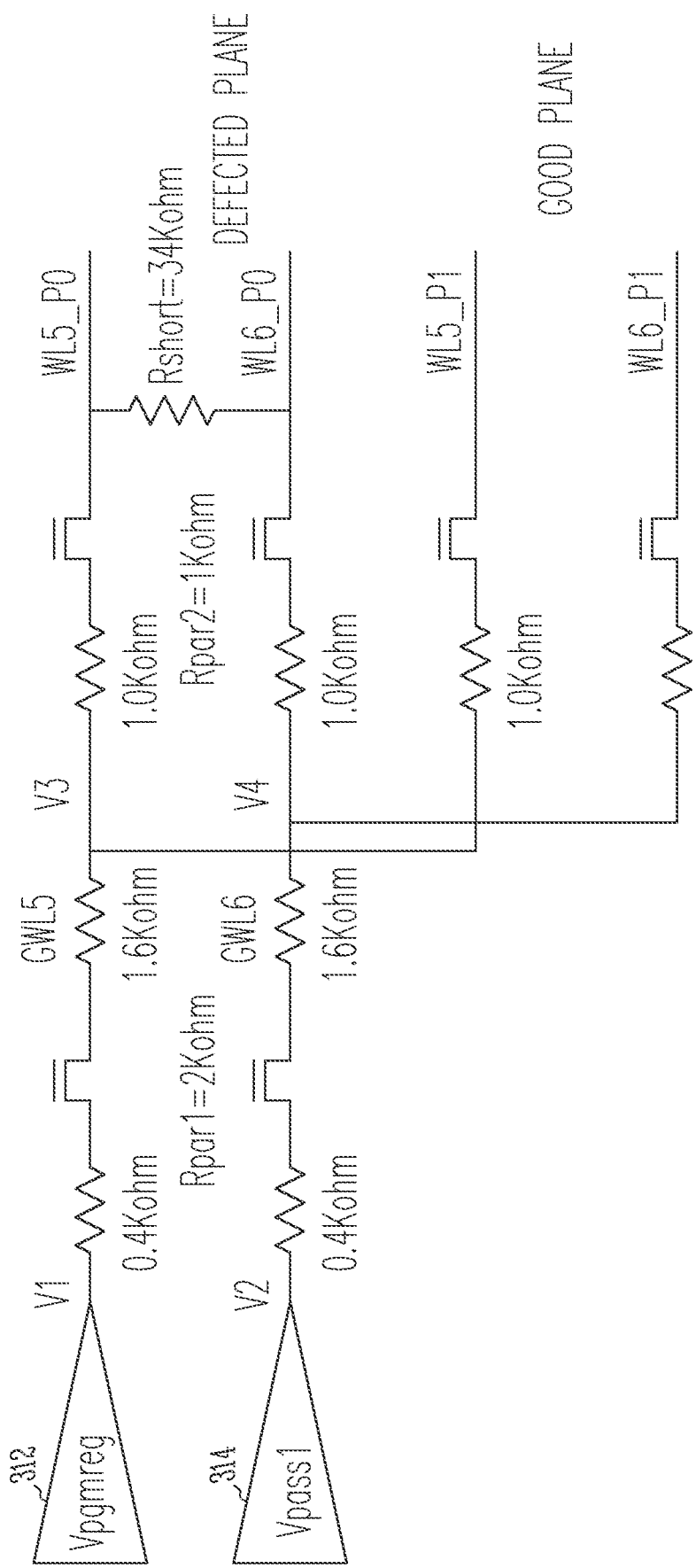
FIG. 3 is an illustration representing word lines applied to two memory planes of the memory device according to some examples described herein.

FIG. 3 is an illustration representing word lines applied to two memory planes of the memory device. Word line drivers 312, 314 apply a target voltage to the global word lines (GWL5, GWL6). The global word lines are connected to local word lines (WL5, WL6) for the first memory plane (P0) and the second memory plane (P1). Word line driver 312 applies a program target voltage V1 to global word line GWL5 which is translated to local word lines WL5_P0, WL5_P1. Word line driver 314 applies a pass target voltage V2 lower than V1 to GWL6 which is translated to local word lines WL6_P0, WL6_P1.

The illustration shows a short (Rshort) between WL5_P0 and WL6_P0 in memory plane P0. The illustration also shows voltages V3 and V4 present on the side of the string transistors away from the global word lines. A comparison of the voltages for the good plane and the defected plane would show a voltage reduction in the program voltage in the defected plane on WL5_P0 and a voltage increase in the pass voltage on WL6_P0 due to Ohm's Law V=R*I. V3 is lower than V1 and V4 is higher than V2. It can be seen from the example in FIG. 3 that the word line short will cause failure of a program operation because WL5_P0 cannot reach the program voltage target.

Figure 4:
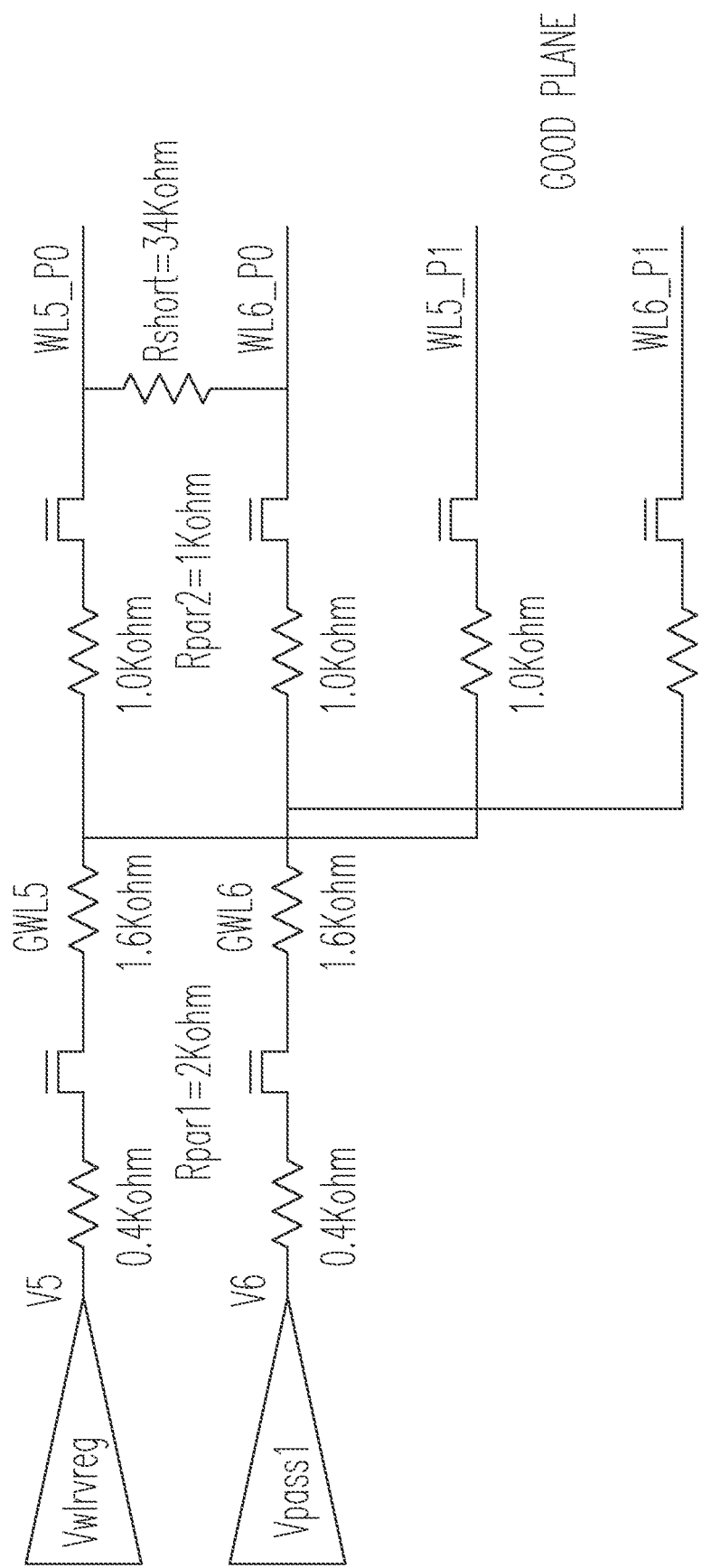
FIG. 4 is another illustration representing word lines applied to two memory planes of the memory device according to some examples described herein.

Other operations such as erase-verify and program-verify may also fail. FIG. 4 is an illustration representing word lines applied to two memory planes of the memory device for a program-verify operation. In this example, V5 is the verify voltage and is less than V6 which is the pass voltage. The short between WL5_P0 and WL6_P0 may cause the voltage on the word line to be higher than the target voltage. Because the voltage is off, the program-verify operation puts the cell distributions into the wrong levels.

Additionally, a word line short in a defective plane can cause a program status fail or an error correction code (ECC) failure in a good plane during a multi-plane programming. This multi-plane error can have a big impact on the memory system. A memory cell defectivity protocol may use Redundant Array of Independent NAND (RAIN) technology. RAIN adds user data protection that extends beyond ECC. In RAIN protection, the memory control unit may use parallelism in order to increase memory device performance and locate stored data across a set of flash devices. To protect against multi-plane errors, RAIN would be implemented at the die level instead of the memory plane level. Thus, trying to esolve the problem with a RAIN approach can have a large impact on the cost of the system.

Word line driver circuits can include a charge pump circuit to generate the voltages for operation of the memory device. Some charge pump circuits charge an array of capacitors operating on different phased clocks to boost an input voltage to a higher voltage (e.g., a program voltage target). The word line driver circuits can include a regulator to monitor the generated voltage. The regulator provides a control loop that stops operation of the charge pump when the desired voltage is reached by the charge pump circuit.

Figure 5:
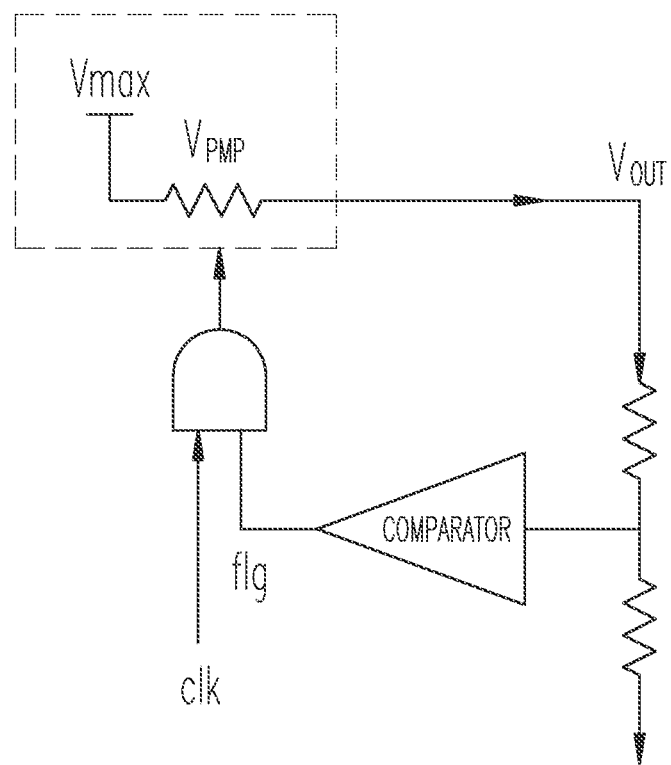
FIG. 5 is a circuit diagram of a charge pump model and a regulator circuit according to some examples described herein.

FIG. 5 is an example circuit diagram of a charge pump circuit model and a regulator circuit. The regulator circuit includes a comparator circuit monitoring the output voltage (Vout). Based on a comparison of the output voltage to the target voltage, the regulator passes or inhibits clock signals to the charge pump using the feedback signal (fig) as a control signal. When the target voltage is reached the regulator stops the charge pump from working. Due to background leakage, the output voltage level will slowly drop when the charge pump is not active. When the output voltage decreases to certain voltage, the regulator circuit restarts the charge pump to bring the output voltage back to the target level.

A word line short will increase the background leakage causing a charge pump circuit to take longer to charge and output voltage faster to decrease. This will increase the use or duty-cycle of the feedback signal or control signal. Monitoring of the control signal can be used to detect a word line short. The regulator circuit can be included in a current sensor circuit or monitor circuit that monitors the operation of the charge pump.

Figure 6A:
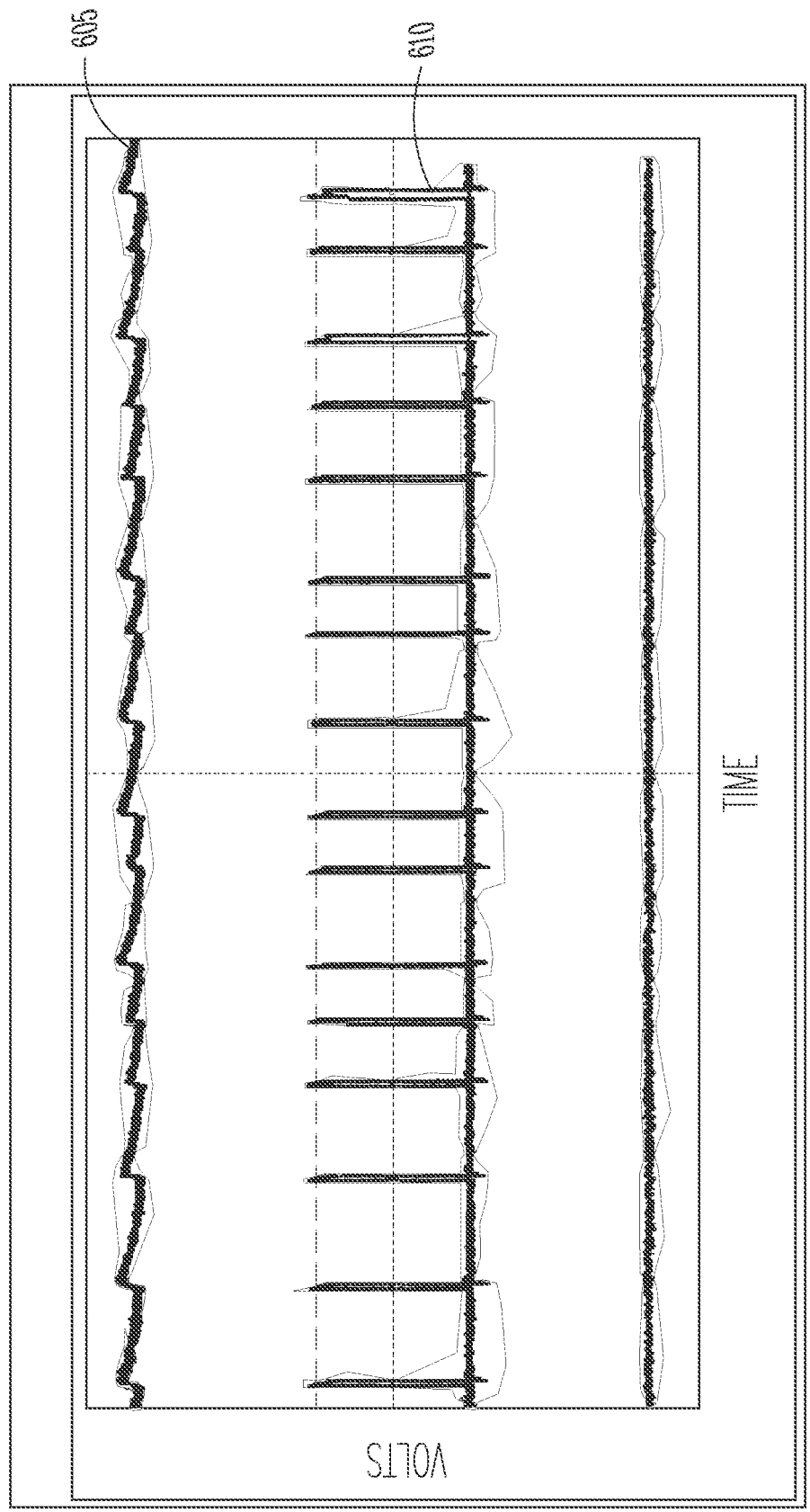
FIGS. 6A-6C show signal waveforms of a charge pump during operation according to some examples described herein.
Figure 6B:
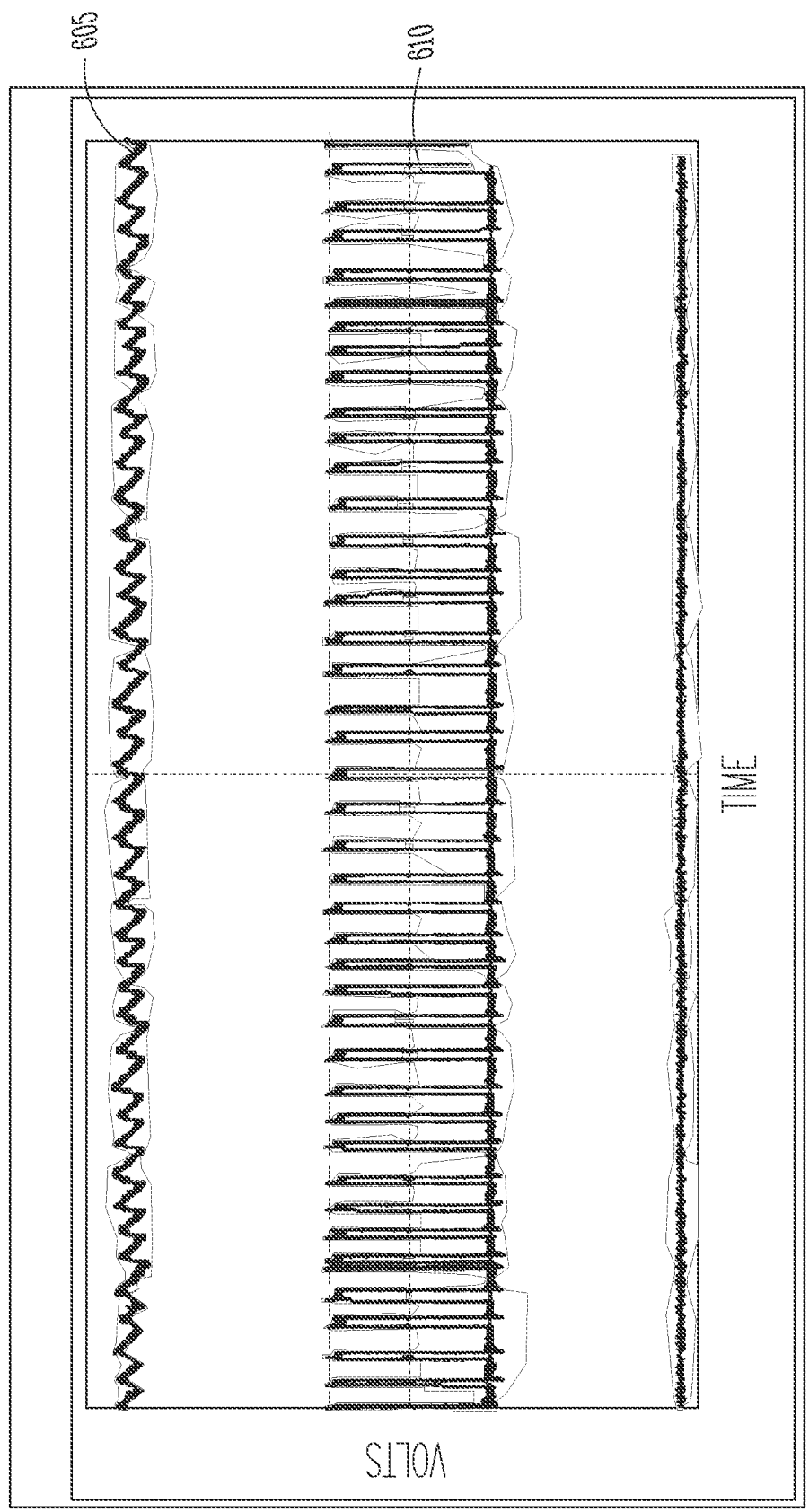
Figure 6C:
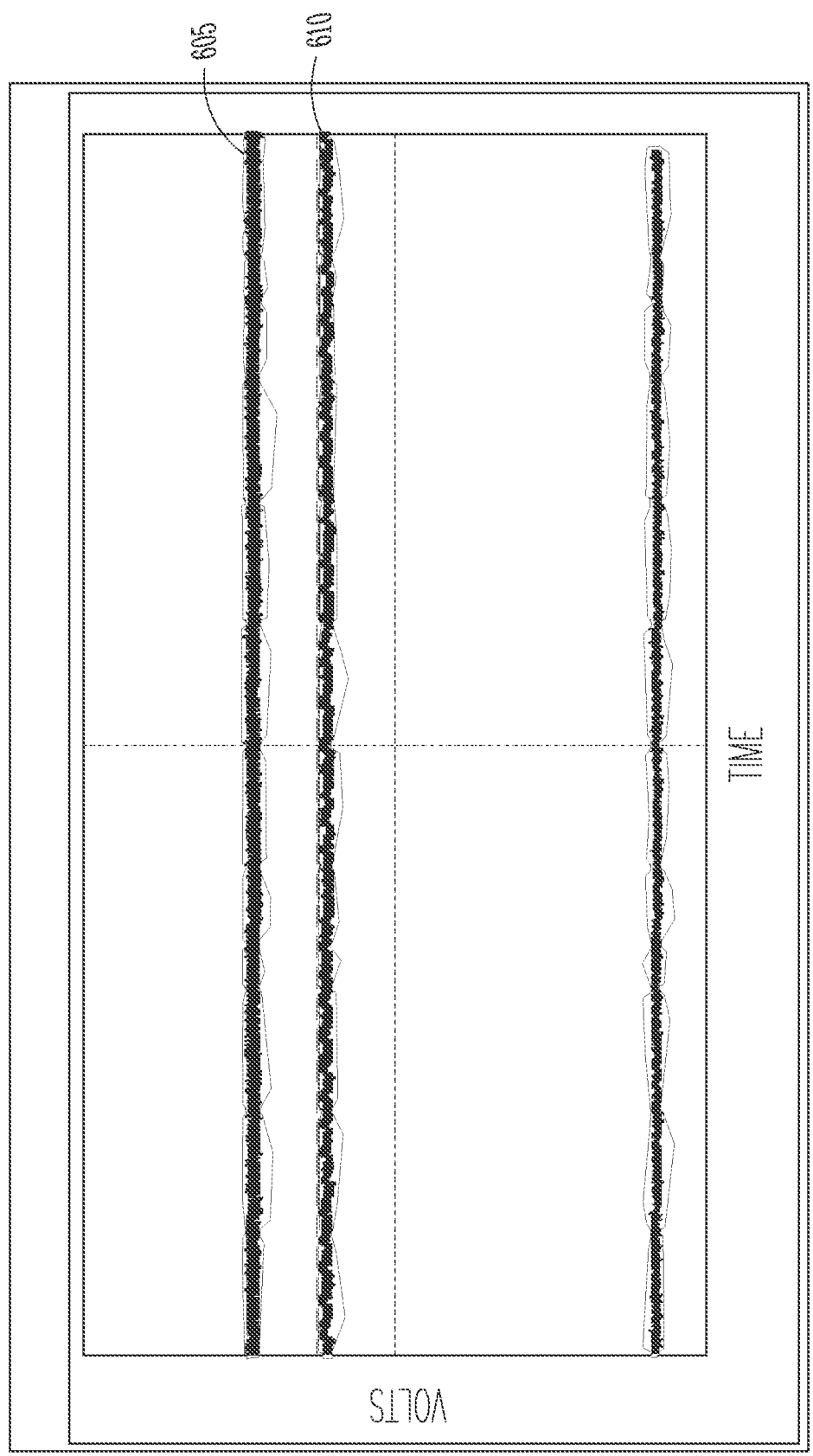

FIG. 6A illustrates exemplary signal waveforms of a charge pump during an erase operation. Waveform 605 is the charge pump output providing a voltage to a word line and waveform 610 is the regulator control signal (e.g., the 'fig' signal in FIG. 5). FIG. 6B illustrates exemplary signal waveforms of the charge pump when 100 kilo-ohm (100 kΩ) short is present on the word line. Waveform 610 shows that the charge pump is much more active in the presence of the short. The output target voltage is still achieved. FIG. 6C illustrates exemplary signal waveforms where the defect is worse than in the example of FIG. 6B. In FIG. 6C, the charge pump is 100% active and the output voltage target is not reached due to the leakage current being larger than the pump capability. The waveform examples show that the monitoring of the time that the control signal provided to the charge pump is active (e.g., high) can be used to detect word line shorts. One approach is to count the number of clocks that the control signal is active in a predetermined span of time. A higher count provides a metric that shows the charge pump is working harder and is being activated at a higher rate. Other approaches to monitor the current are described in regard to FIGS. 15-17.

Figure 7:
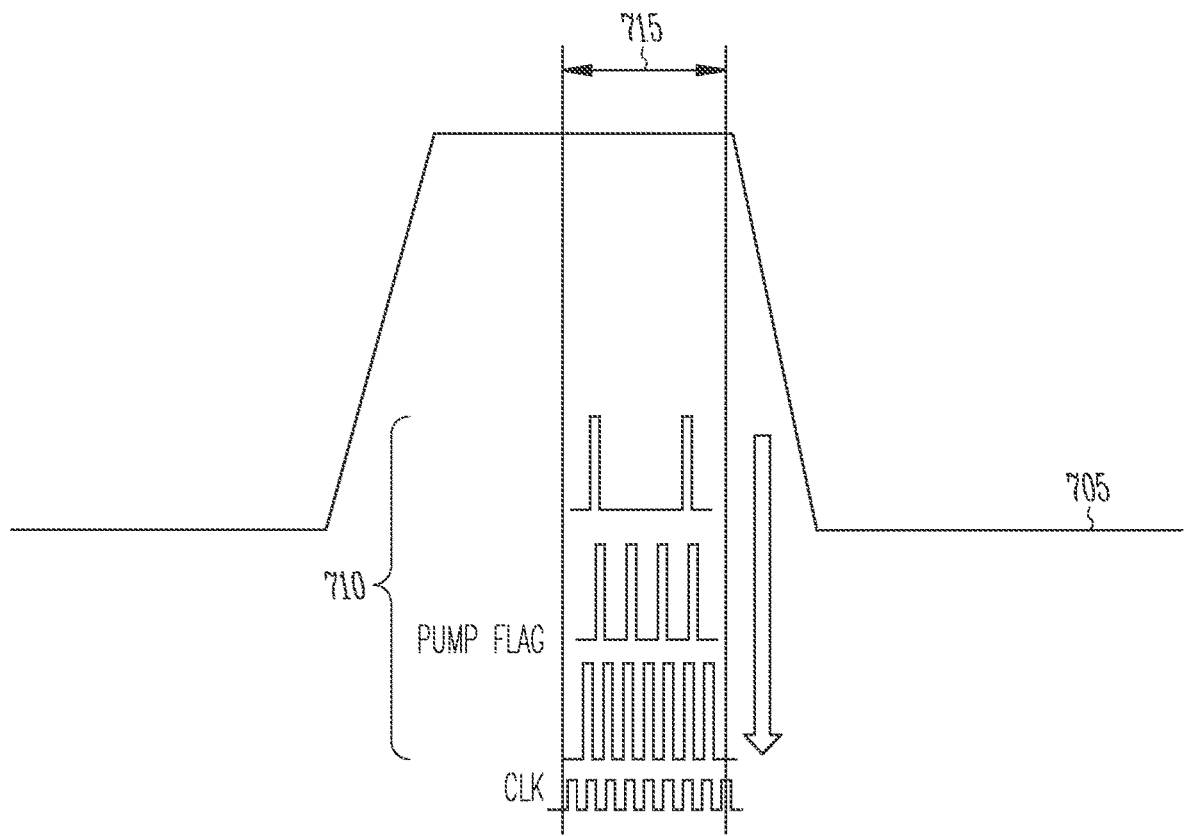
FIG. 7 is an illustration of examples of signal waveforms used in a memory operation according to some examples described herein.

FIG. 7 is an illustration of examples of signal waveforms used in a memory operation. Waveform 705 is the array operation pulse (e.g., an erase pulse, a program pulse, etc.) applied to the memory device. Waveforms 710 show the control signal (e.g., 'flg' in FIG. 5) for different levels of leakage due to a word line short. During time window 715, a counter tracks the number of times that the control signal goes high. The number of times that the control signal goes high within the window reflects the rate at which the pump circuit is activated. When the number exceeds a specified threshold count a fault is detected.

Figure 8:
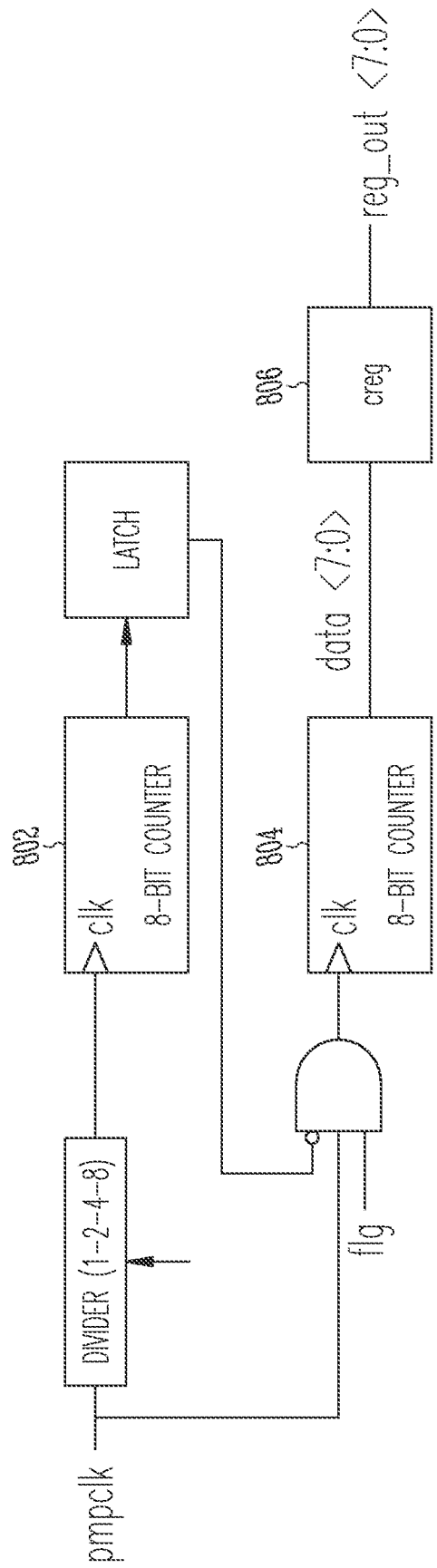
FIG. 8 is an example of a circuit to monitor operation of a charge pump according to some examples described herein.

FIG. 8 is an example of a logic circuit 800 to monitor operation of a charge pump used to generate a target voltage for a word line. The logic circuit 800 can be included in a sensor circuit to monitor current of the charge pump circuit. The logic circuit 802 includes two counters 802, 804. The inputs to the counters are the charge pump clock and the control signal (fig). Counter 802 controls the duration of the timing for the counting (e.g., timing window 715 in FIG. 7) and counter 804 counts the number of clocks that the control signal is high. The count is then pushed to a control register 806. The logic circuit can be coupled to or integral to a memory controller of the memory device and the memory controller can determine when the value in the control register indicates a defect or fault. In variations, only the most significant bits (MSBs) of the counter 804 (e.g., the four MSBs) are pushed to the control register 806 to monitor the current. This reduces the overhead for the monitoring circuitry.

Figure 9:
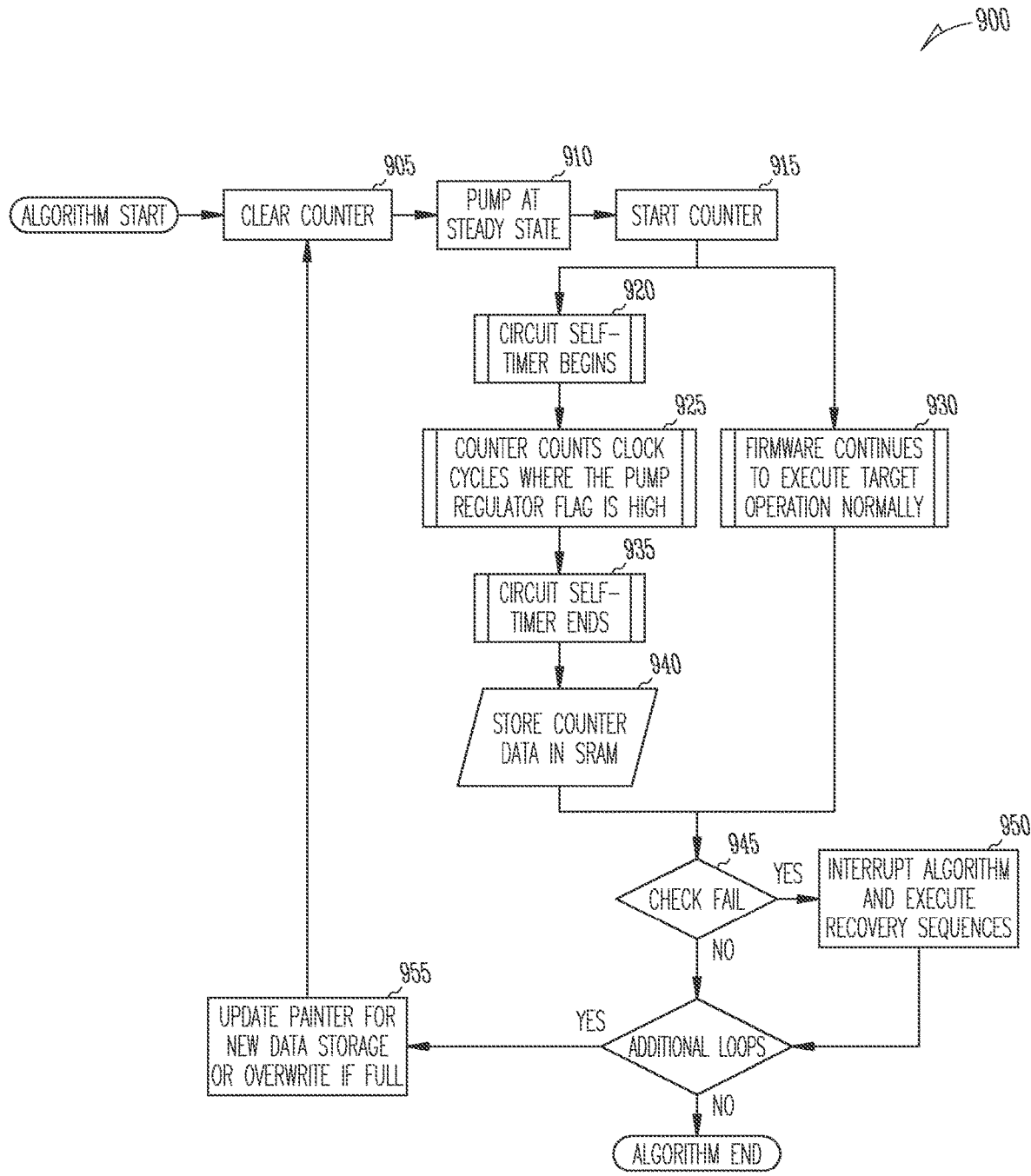
FIG. 9 is a flow diagram of a method for detecting a defect in a memory array according to some examples described herein.

FIG. 9 is a flow diagram of a method 900 for detecting a defect in a memory array. The method detects a memory array degradation or defect by monitoring the current output of a charge pump using a current sensor circuit or monitor circuit. Method 900 is performed, for example, by a memory controller (e.g., memory control unit 218) and a current sensor/monitor circuit (e.g., current sensor/monitor circuit depicted in FIG. 5, 8, 16, 17, or 18). The current sensor circuit includes a counter circuit, and the counter circuit is cleared at 905 in FIG. 9. When the charge pump is at steady state 910 (e.g., a time duration after the operation pulse in FIG. 7 is asserted), the counter circuit is started at 915. At 920, a circuit self-timer begins (e.g. to time window 715 in FIG. 7). At 925, the counter circuit counts the number of clock cycles where the charge pump control signal is high. Meanwhile, the memory controller of the memory device continues at 930 to execute the current memory operation (e.g., according to firmware).

At 935, the self-timing ends and at 940 the counter result is pushed to SRAM. The SRAM may include a control register that is checked by the memory controller to determine when the counter result indicates a defect or fault. At 945, if the counter result indicates a failure (e.g., by exceeding a specified count), the current memory operation being performed by the memory controller of the memory device is interrupted at 950 and recovery sequences may begin. Exemplary recovery sequences are described in greater detail with reference to FIG. 13. If the counter result does not indicate a failure and no additional loops are needed, at 955 a pointer for the counter result may be updated or the counter result may be overwritten.

Another approach to monitor operation of the charge pump is to integrate the control signal. This approach provides an estimate of the output current provided by the charge pump to the word line, essentially making the circuit that monitors the charge pump circuit a current sensor circuit. Measuring the duty cycle of the control signal provides an estimate of the output current.

Figure 10:
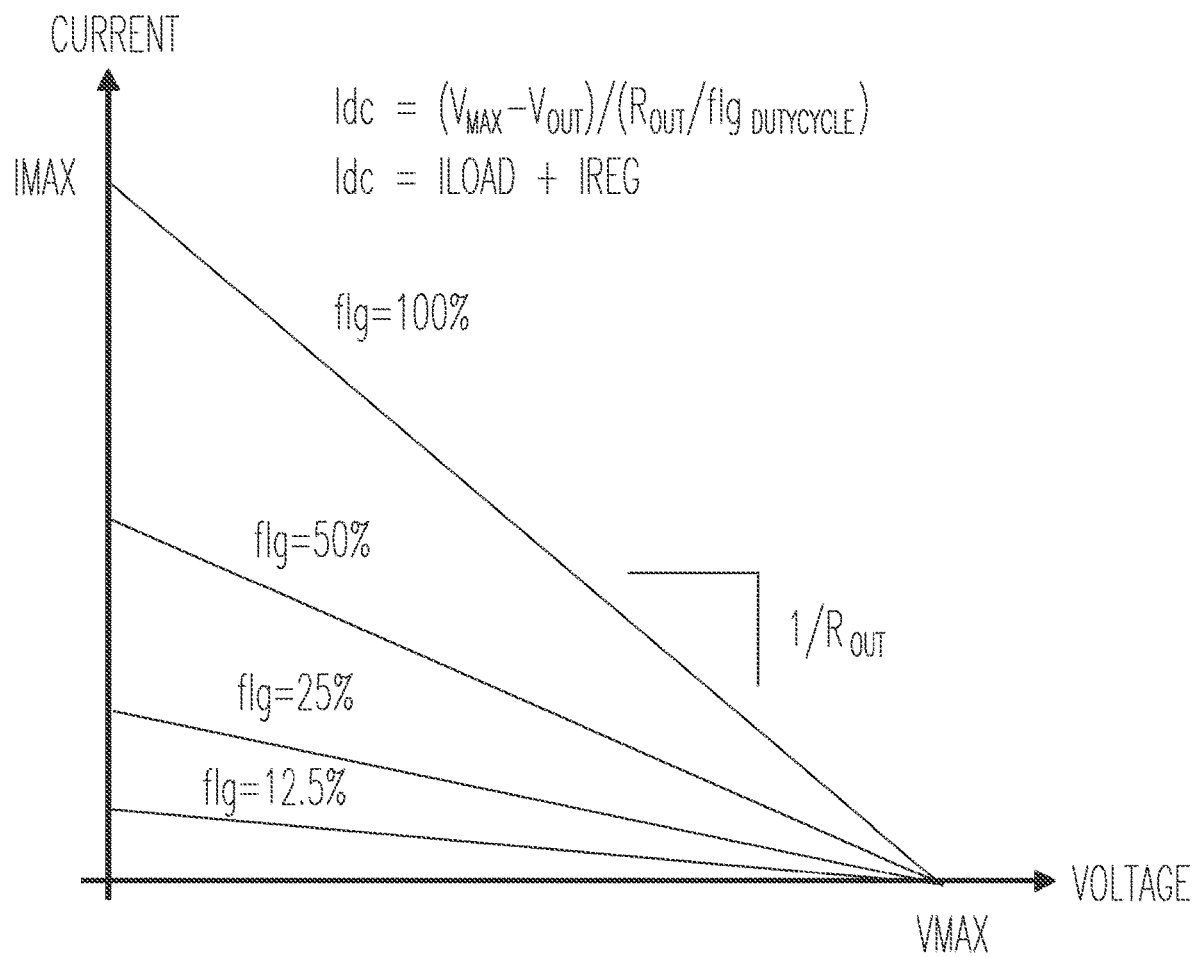
FIG. 10 is a graph of the duty cycle of a control signal versus output impedance for a control loop of a charge pump according to some examples described herein.

Returning to FIG. 5, adding a counter circuit to the regulator circuit provides a sensor circuit to monitor current of the charge pump circuit. The charge pump is modeled as an ideal voltage source with finite output impedance Rpmp. The 'flg' signal is the pump regulator digital loop control signal. The output impedance is modulated by the duty cycle of the control signal. FIG. 10 is a graph showing how the output impedance of a charge pump changes with variation in the duty cycle of the control signal. The parameters Vmax and Rout of the charge pump are characterized on the silicon, and Vout is the target regulation voltage during the NAND algorithm. By direct association of the count of the sensor to the duty-cycle of the control signal 'flg', it is possible to determine the leakage current contribution of the short Idc.

The monitor circuit or sensor circuit monitors the duty cycle after current is provided to the word line load ($I_{AC}$) and the charge pump reaches the voltage target (e.g., a program voltage target). The duty cycle of the control signal is determined after the charge pump reaches the target voltage. If the duty cycle is greater than a specified threshold duty cycle, then the memory controller of the memory device may indicate a fault or defect.

To monitor the duty cycle, the counter of the monitor circuit or sensor circuit may be started to count the number of clock pulses delivered to the charge pump circuit within a specified period of time after the charge pump reaches the voltage target. Logic circuitry of the memory controller may compare the count to a specified threshold count to detect the defect.

The threshold count used in the defect detection may be the same for every device or each device may perform a calibration sequence to establish a baseline count to use as the threshold. This calibration may be performed in real time during the operation of the memory device or as part of an initial trim of the memory device. During the calibration, the charge pump is not connected to any load. The charge pump generates the voltage target for the calibration and a trim count is obtained. The current reflected by the trim count result reflects the current needed for regulation only, without any memory array load or defect.

More than one calibration trim may be performed. The voltage target may set to high voltage target (a high program voltage target, e.g., ~24V) to obtain a first baseline count, and a low voltage target (a low program voltage target, e.g., ~14V) to obtain a second baseline count. Baselines for intermediate program levels may be interpolated using the high and low baseline counts.

Figure 11:
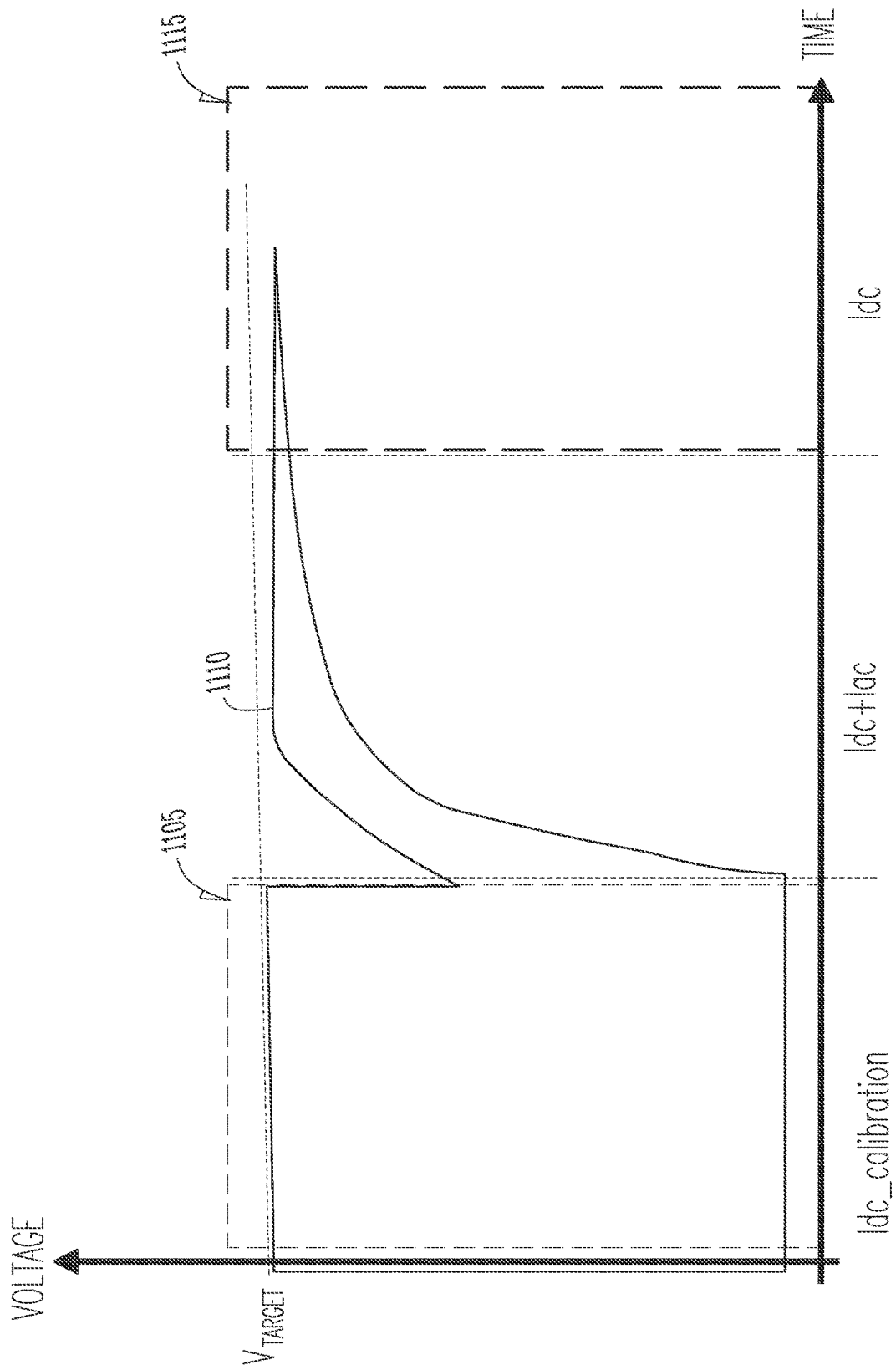
FIG. 11 is an illustration of a calibration window and a measurement window for current sensing of a charge pump according to some examples described herein.

FIG. 11 is an illustration of a calibration window and a measurement window for the current sensing. The vertical axis is the output voltage of the charge pump and the horizontal axis is time. The calibration window 1105 is during a time that the charge pump is at the voltage target. The calibration may be done in real time during a memory operation. At 1110, current is provided to the word line. The output voltage dips in response to the load and then recovers. The measurement window 1115 begins a specified time after Iac is applied.

Figure 12:
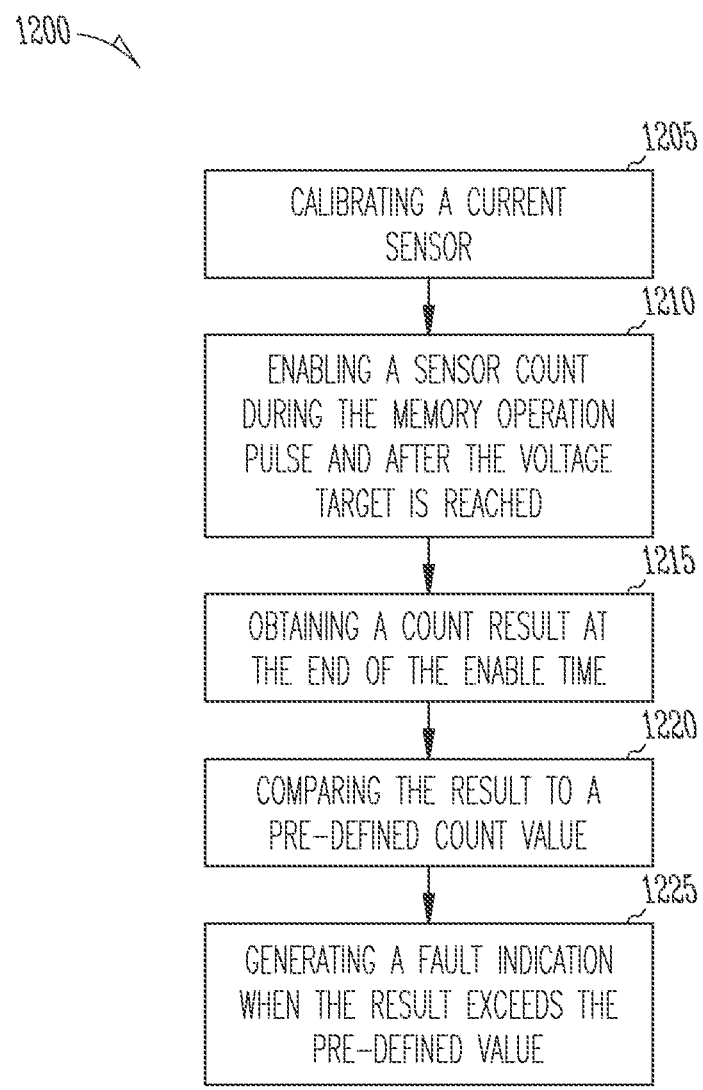
FIG. 12 is a flow diagram of a method of another method of detecting a defect in memory array according to some examples described herein.

FIG. 12 is a flow diagram of a method 1200 of detecting a defect in memory array. The method can be included in an algorithm (e.g., firmware instructions) performed by the memory controller of the memory device. The method can detect a defect such as a word line short by estimating the current output to the word line using a current sensor circuit or monitor circuit. At 1205, the sensor circuit is calibrated before the operation pulse (e.g., a program pulse, erase pulse or read pulse) in real time, or the calibration may have been done previously as batch trim. At 1210, the count for the current sensing is started during the operation pulse and after the voltage target for the operation is reached. For example, the count may be started a specified period of time after the charge pump reaches the voltage target. The sensor circuit may be enabled for a short-predetermined time (e.g., the last six microseconds (6 μs) of the program pulse). In this way, the sensor circuit monitoring is within the program pulse and the time for the pulse is not extended because of the monitoring. However, the longer the monitoring time the better the detection. In certain examples, the sensor circuit monitoring is triggered whenever the program pulse is applied. In variations, the sensor circuit monitoring is triggered when the program voltage is changed. The sensor circuit monitoring can be used for other operations (e.g., verify operations) and the monitoring can be triggered when the memory operation is changed, or the target voltage is changed. The current monitoring is performed within the operation pulse before the operation pulse ends.

At 1215, at the end of the enable time the count result is in the counter. A higher count value for the same count duration means the charge pump was working harder. At 1220, the result is compared to the pre-define value (e.g., the calibration baseline count). If the count is higher than the pre-defined value, extra or unexpected leakage current was required during the operation pulse and there is likely a word line short. At 1225, a fault indication may be generated when the count is greater than the pre-defined value. The memory controller may halt the current operation. If the operation is a program operation, ideally the problem is detected during the first program pulse before entering a program-verify operation.

Figure 15:
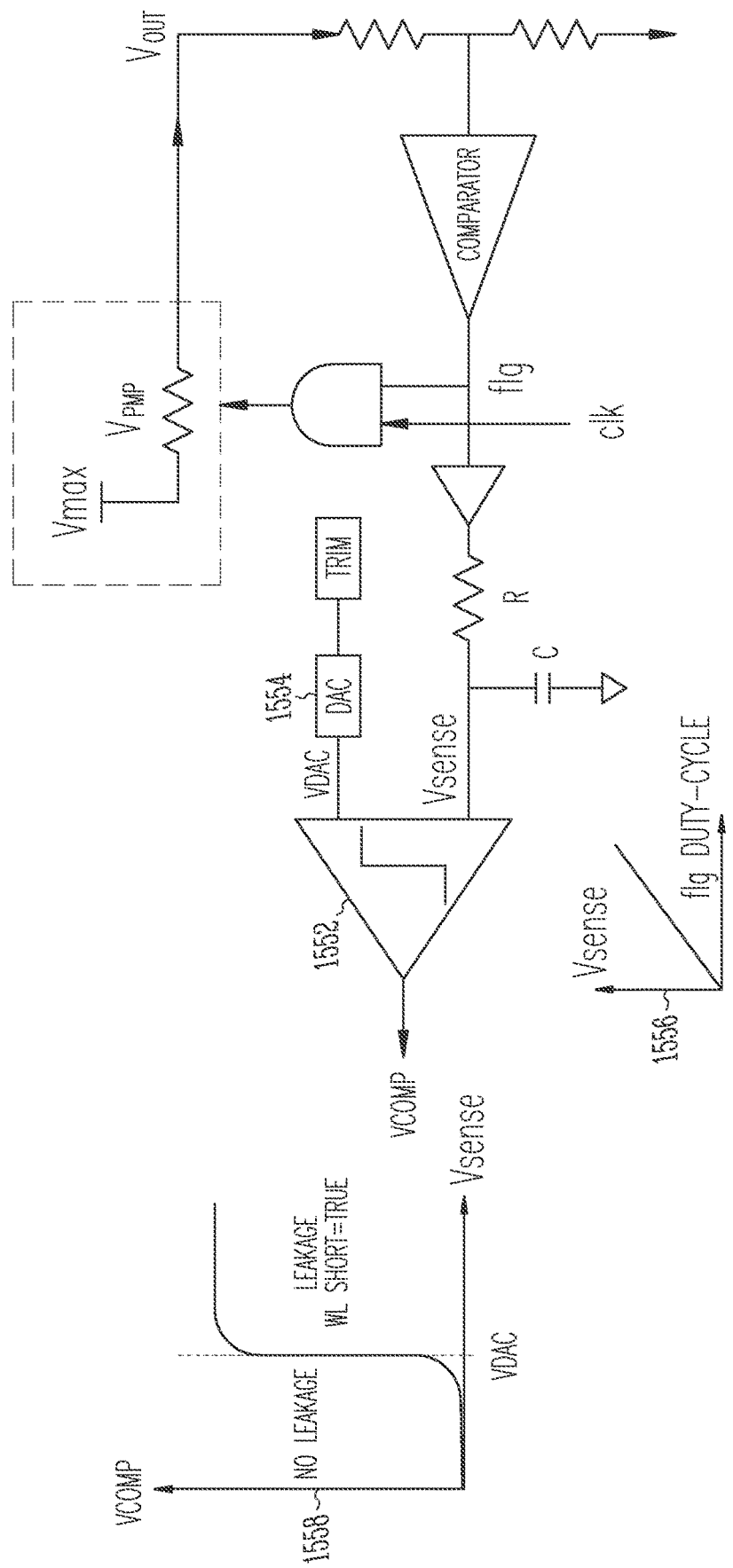
FIG. 15 is another example of a circuit to monitor operation of a charge pump according to some examples described herein.

FIG. 15 is another example of a sensor circuit or monitor circuit to monitor current of a charge pump according to some examples described herein. On the right in FIG. 15 are shown the charge pump circuit model and the regulator circuit from the example of FIG. 5. The monitoring circuit in FIG. 15 includes a low pass filter (comprised of the RC pair), a digital-to-analog converter (DAC) circuit 1554, and a second comparator 1552. The control signal 'flg' of the regulator circuit is applied to the low pass filter to create a signal Vsense. In variations, a higher order low pass filter can be used. As shown in graph 1556, Vsense increases as the duty cycle of 'flg' increases. The DAC circuit 1554 provides a trimmable analog voltage reference vdac. The voltage reference vdac can be trimmed to a value that indicates when the duty cycle of 'flg' has increased to the point that leakage is occurring that is overworking the charge pump (e.g., due to a word line short). Vsense is compared to the voltage reference vdac using comparator 1552. When Vsense exceeds vdac the comparator output vcomp indicates a fault. The comparator output vcomp is shown as a function of Vsense in graph 1558.

Figure 16:
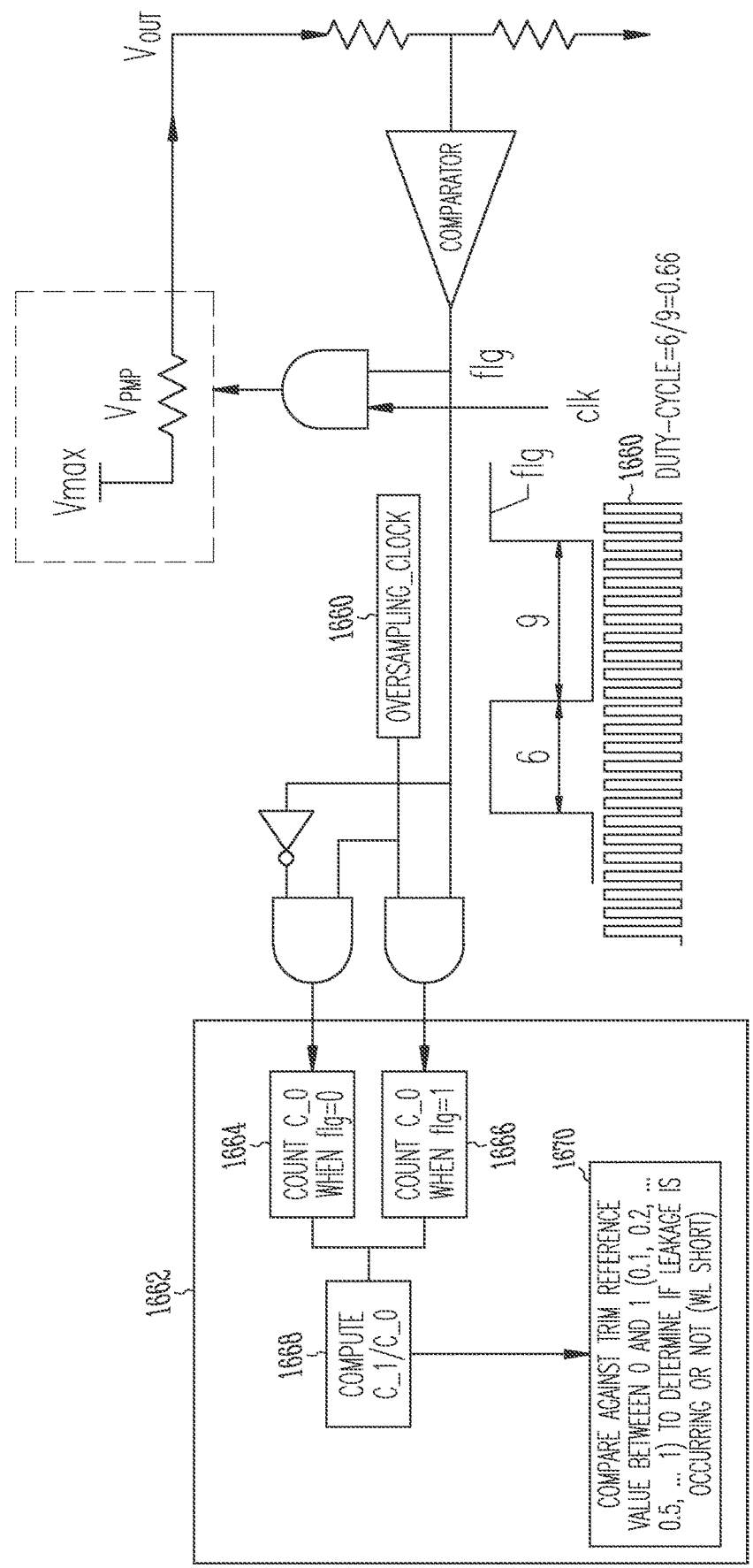
FIG. 16 is still another example of a circuit to monitor operation of a charge pump according to some examples described herein.

FIG. 16 is another example of a circuit to monitor current of a charge pump according to some examples described herein. In this example, the duty cycle of the control signal 'flg' is estimated digitally. In the monitoring circuit, an oversampling clock signal 1660 is applied to logic 1662 that counts edges of the over sampling clock signal 1660. The oversampling clock signal has a much higher frequency than the clock signal 'clk' that is used to operate the charge pump (e.g., the frequency of oversampling clock is 20 times the frequency of 'clk'). The logic 1662 generates first count C_1 at 1664 of the number of edges of the oversampling clock signal that occur while 'flg' is in the high state, and produces a second count C_0 at 1666 of the number of edges of the oversampling clock signal that occur while 'flg' is in the low state. The logic 1662 computes the ratio of the two counts at 1668 as an estimate of the duty cycle (e.g., ratio=C_1/C_0).

The example of FIG. 16 shows an example waveform of 'flg' and the oversampling clock 1660. In the example 'flg' Is high for six edges of the oversampling clock signal (C_1=6) and 'flg' is low for nine edges of the oversampling clock signal (C_0=9). The logic 1662 computes the estimated duty cycle to be 6/9 or 0.66. At 1670, the logic compares the estimated duty cycle to a reference trim value between 0 and 1 (e.g., trim=0.1, 0.2, ... , 0.5, ... 1) to determine if leakage is occurring that is overworking the charge pump (e.g., due to a word line short). The logic 1662 of the monitoring circuit can be implemented in hardware or firmware or as a combination of hardware and firmware.

Figure 17:
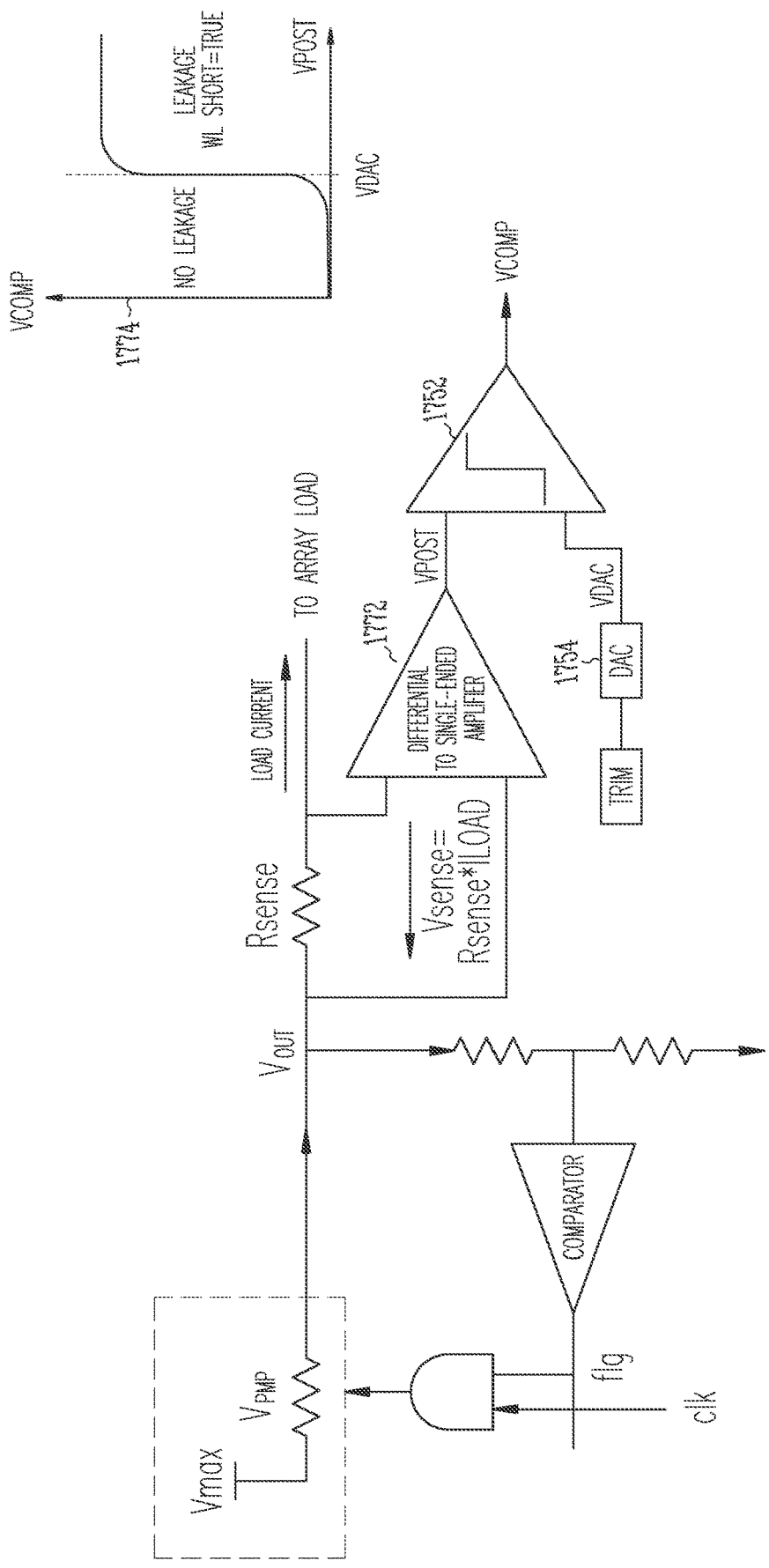
FIG. 17 is a further example of a circuit to monitor operation of a charge pump according to some examples described herein.

FIG. 17 is another example of a circuit to monitor current of a charge pump according to some examples described herein. The monitoring circuit includes a sense resistor Rsense in the path from the charge pump circuit to the memory array load. The sense resistor converts the load current into a voltage Vsense across the sense resistor that is sensed using a differential amplifier 1772. The output of the amplifier 1772 is compared to trimmable voltage reference vdac using comparator 1752. The voltage reference vdac can be trimmed using the DAC 1754 to a value to meet a leakage threshold for the load current. When the voltage output from the amplifier 1772 vpost exceeds the reference vdac, the comparator output vcomp indicates a fault. The comparator output vcomp is shown as a function of vpost in graph 1774.

The fault indication from a sensing or monitoring circuit may be sent by the memory controller of the memory device to the host device, and the system may take steps to address the problem. If the memory operation is a multi-plane operation it can be useful to identify the memory plane having the defect. The system may then remove the defective memory plane from subsequent memory operations.

Figure 13:
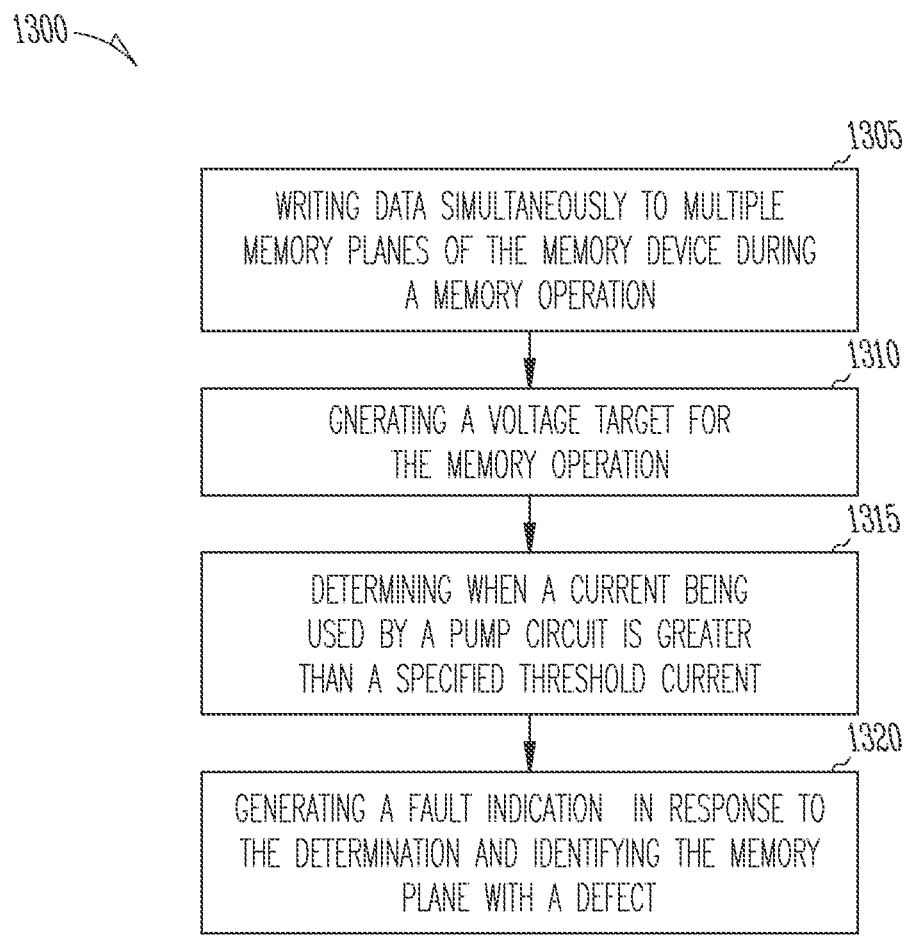
FIG. 13 is a flow diagram of an example of a method of operating a memory device according to some examples described herein.

FIG. 13 is a flow diagram of an example of a method 1300 of operating a memory device. Method 1300 is performed, for example, using a memory controller and a current sensor/monitor circuit. At 1305, data is simultaneously written to multiple memory planes of memory cells of the memory device during a memory operation (e.g., write/program operation). At 1310, a voltage target is generated for the memory operation. The voltage is to be applied to the word line of each memory plane. The voltage target may be generated by using a charge pump circuit for example. At 1315, the memory device determines when the current generated by the pump circuit of a memory plane is greater than the specified threshold current, such as by using a current sensor/monitor circuit for example. At 1320, a fault indication is generated in response to the determination. As described in greater detail below, the fault indication may identify the memory plane with the fault indication.

If the word line drivers for the memory device utilize a different charge pump for each memory array plane, the memory plane with the problem (e.g., containing the defect) may be identified more directly. In particular, a current sensor or monitor can be provided for each charge pump of each plane. Identifying the charge pump that had to work harder and has a higher count identifies the memory plane with the defect. For example, a fault indication generated by the current sensor or monitor of a specific memory plane can serve to identify that specific memory plane as containing the problem. In response, the memory controller may then exclude (e.g., disable) the memory plane from subsequent memory operations. For example, the specific block accessed in the identified memory plane during the memory operation may be disabled. In some examples, the memory controller can identify the memory plane to the host device and the host device may exclude (or cause the memory device to exclude) the memory plane (e.g., the corresponding block in the memory plane) from subsequent memory commands or requests.

If one charge pump is shared among more than one memory plane for memory operations (e.g., write/program operations), identifying the memory plane with the problem may include additional operations. One approach is to have the memory controller change modes to identify the defective plane. In a normal operating mode, more than one memory plane is accessed simultaneously during a memory operation. For example, write data may be written to respective blocks of multiple memory planes in a normal operating mode (e.g., operation 1305). In response to the sensor circuit indicating a fault, the memory controller changes to another operating mode in which only one memory plane is accessed (e.g., written) at a time. For example, the write operation can be repeated in another operating mode where each of the more than one memory planes are separately accessed (e.g., in sequence). When the sensor circuit detects a higher count for a memory operation to a specific memory plane, that memory plane is identified (e.g., via a fault indication) as the memory plane with a defect. In response to identifying the memory plane having the defect, the memory controller or the host device may then perform one or more recovery operations. For example, the memory controller or the host device may exclude the corresponding block of the identified memory plane from subsequent memory operations.

Another approach to identify the memory plane with the defect is to track errors in memory planes for memory operations. If more errors occur in one of the memory planes, that memory plane may be the memory plane with the defect. In response to the sensor circuit indicating a fault, the memory controller may send the indication of a fault to the host controller, and identify the memory plane having the defect as the memory plane for which the number of errors exceeds a threshold number of errors. Another approach to identifying the memory plane with the defect is to determine if a memory plane is showing a number of failures of program-verify operations (e.g., number of failed bits of program-verify operations). In response to the sensor circuit indicating a fault and detecting that one of the memory planes is experiencing program-verify operation failure, the memory controller may identify that memory plane with the indication of a fault sent to the host device.

As in the previous examples, one or more recovery operations may be performed in response to the fault indication. For example, the identified memory plane may be excluded from subsequent memory operations. If the memory operation was a program operation, the memory controller may re-buffer the data received for the program operation when the current sensor indicates the fault indication. This avoids unrecoverable data loss in the event of a defect. In some examples, the host device may exclude the address used for the program operation from subsequent operations.

The methods, devices, and systems described herein can detect defects in the form of shorts in the device (e.g., word line to word line, word line to bit line, word line to pillar, etc.). The detection can be at the time the device is fabricated and before it is shipped from the factory (time zero). The detection can also be made during operation of the device to detect memory defects any time throughout the lifetime of the device by employing hardware-based real-time detection.

Figure 14:
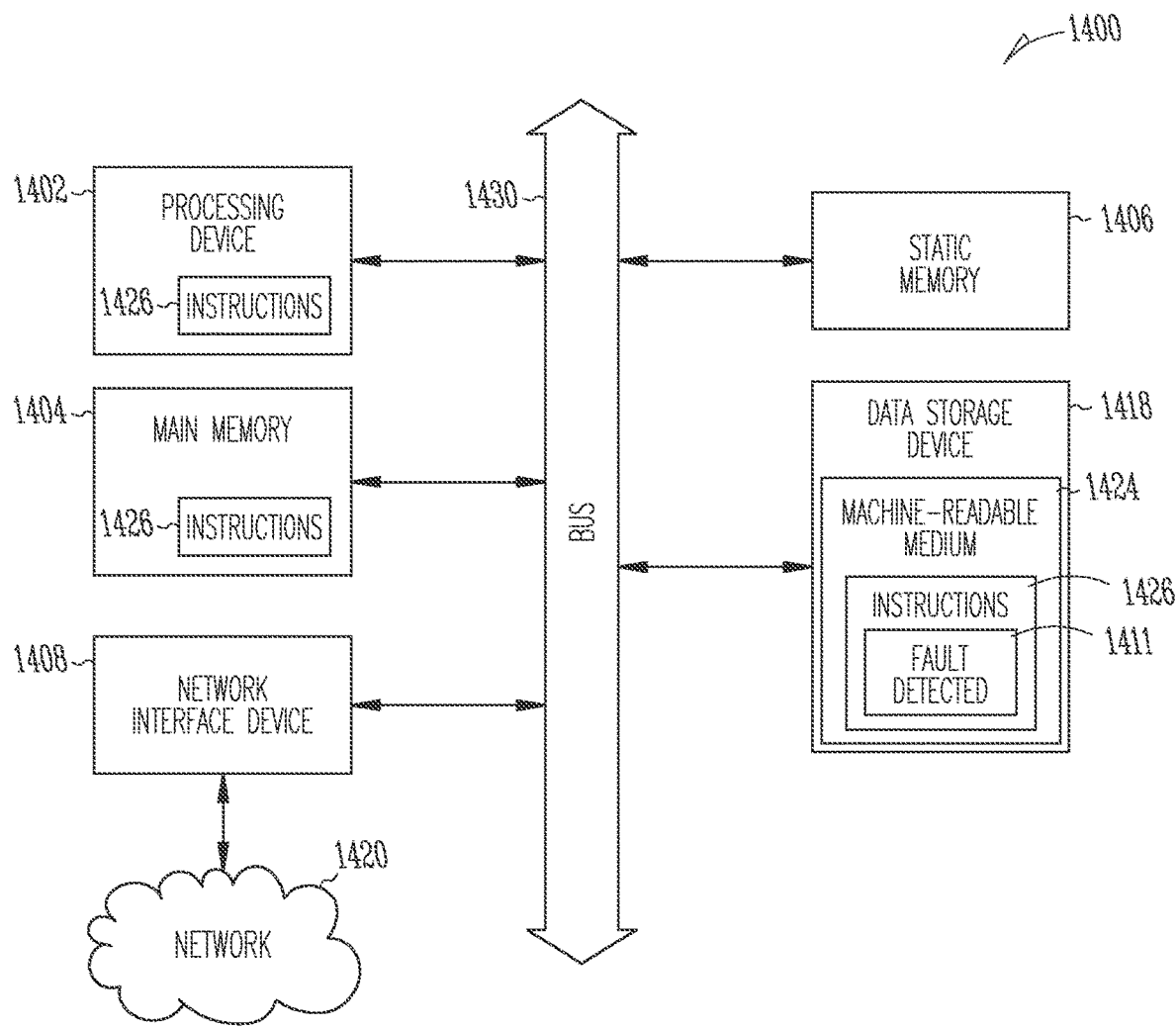
FIG. 14 illustrates a block diagram of an example machine according to some examples described herein.

FIG. 14 illustrates a block diagram of an example machine 1400 upon which any one or more of the techniques (e.g., methodologies) discussed herein may perform, such as the described finer trim programming operations for extreme operating temperatures for example. In alternative examples, the machine 1400 may operate as a standalone device or may be connected (e.g., networked) to other machines. In a networked deployment, the machine 1400 may operate in the capacity of a server machine, a client machine, or both in server-client network environments. In an example, the machine 1400 may act as a peer machine in peer-to-peer (P2P) (or other distributed) network environment. The machine 1400 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The embodiments and examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1400 (e.g., the host 105, the memory device 110 of FIG. 1, etc.) may include a processing device 1402 (e.g., a hardware processor, a central processing unit (CPU), a graphics processing unit (GPU), a hardware processor core, or any combination thereof, such as a memory control unit of the memory device 110, etc.), a main memory 1404 (e.g., read-only memory (ROM), flash memory, dynamic random-access memory (DRAM) such as synchronous DRAM (SDRAM) or Rambus DRAM (RDRAM), etc.), a static memory 1406 (e.g., flash memory, static random-access memory (SRAM), etc.), and a data storage system 1418, some or all of which may communicate with each other via an interlink (e.g., bus) 1430.

The processing device 1402 can represent one or more general-purpose processing devices such as a microprocessor, a central processing unit, or the like. More particularly, the processing device 1402 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1402 can also be one or more special-purpose processing devices such as an application specific integrated circuit (ASIC), a field programmable gate array (FPGA), a digital signal processor (DSP), network processor, or the like. The processing device 1402 can be configured to execute instructions 1426 for performing the operations and steps discussed herein. The machine 1400 can further include a network interface device 1408 to communicate over a network 1420.

The data storage system 1418 can include a machine-readable storage medium 1424 (also known as a computer-readable medium) on which is stored one or more sets of instructions 1426 or software embodying any one or more of the methodologies or functions described herein. The instructions 1426 can also reside, completely or at least partially, within the main memory 1404 or within the processing device 1402 during execution thereof by the machine 1400, the main memory 1404 and the processing device 1402 also constituting machine-readable storage media. The machine-readable storage medium 1424, the data storage system 1418, or the main memory 1404 can correspond to the memory device 110 of FIG. 1. In one implementation, the instructions 1426 include instructions 1411 contained in firmware to implement functionality corresponding to communicating a memory fault for the memory device (e.g., the operations of FIG. 9, FIG. 12, or FIG. 13).

While the machine-readable storage medium 1424 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 1400 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 1400 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 1426 (e.g., software, programs, an operating system (OS), etc.) or other data are stored on the data storage device 1418 can be accessed by the main memory 1404 for use by the processing device 1402. The main memory 1404 (e.g., DRAM) is typically fast, but volatile, and thus a different type of storage than the data storage device 1418 (e.g., an SSD), which is suitable for long-term storage, including while in an "off" condition. The instructions 1426 or data in use by a user or the machine 1400 are typically loaded in the main memory 1404 for use by the processing device 1402. When the main memory 1404 is full, virtual space from the data storage device 1418 can be allocated to supplement the main memory 1404; however, because the data storage device 1418 device is typically slower than the main memory 1404, and write speeds are typically at least twice as slow as read speeds, use of virtual memory can greatly reduce user experience due to storage device latency (in contrast to the main memory 1404, e.g., DRAM). Further, use of the data storage device 1418 for virtual memory can greatly reduce the usable lifespan of the data storage device 1418.

In contrast to virtual memory, virtual memory compression (e.g., the Linux-™ kernel feature "ZRAM") uses part of the memory as compressed block storage to avoid paging to the data storage device 1418. Paging takes place in the compressed block until it is necessary to write such data to the data storage device 1418. Virtual memory compression increases the usable size of the main memory 1404, while reducing wear on the data storage device 1418.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 1424 may further be transmitted or received over a network 1420 using a transmission medium via the network interface device 1408 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1408 may include one or more physical jacks (e.g., Ethernet, coaxial, or phone jacks) or one or more antennas to connect to the network 1420. In an example, the network interface device 1408 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1400, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, unless stated otherwise the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

Additional Description

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory device comprising:
a memory array including memory cells;
a word line driver circuit including:
a charge pump circuit configured to generate a program voltage target to be applied to a word line to program a memory cell of the memory array, wherein the charge pump circuit receives a charge pump clock to activate the charge pump; and
a control loop to activate the charge pump circuit using a control signal according to a comparison of a pump circuit output voltage to the program voltage target;
a sensor circuit configured to compare a rate that the charge is active for a specified window of time that starts after the charge pump circuit output reaches the program voltage target, and provide an indication of current generated by the charge pump circuit according to the rate;
a first counter to time the window of time, and a second counter to count the number of charge pump clocks that occur during the window of time; and
logic circuitry configured to determine when the current generated by the charge pump circuit is greater than a specified threshold current when the second counter exceeds a threshold count during the window of time of the first counter, and generate a fault indication according to the determination.

2. The memory device of claim 1, wherein the logic circuitry is configured to use a specified number of most significant bits of the count of the second counter to determine when the current generated by the charge pump circuit is greater than the specified threshold current.

3. The memory device of claim 1, including a memory controller configured to:
write data to multiple memory planes of memory cells of the memory device simultaneously during a write operation;
identify, in response to determining that the current generated by the pump circuit is greater than the specified threshold current, a memory plane having a defect according to a number of failed bits of program-verify operations of the memory plane; and
include an indication of the identified memory plane in the fault indication communicated to the host device.

4. The memory device of claim 1, including a memory controller configured to:
write data to multiple memory planes of memory cells of the memory device simultaneously during a write operation;
identify, in response to determining that the current generated by the pump circuit is greater than the specified threshold current, a memory plane having a defect according to a number of memory errors of the memory cell plane; and
include an indication of the identified memory plane in the fault indication communicated to the host device.

5. The memory device of claim 1, including a memory controller configured to:
enable the sensor circuit during a program mode of the memory device to provide an indication of current generated by the pump circuit after the pump circuit output reaches a program target voltage;
re-buffer data received with a program command in response to detecting that the current generated by the pump circuit during the program mode is greater than the specified threshold current; and
exclude an address for the program command from subsequent memory commands by the host device in response to the generated fault indication.

6. The memory device of claim 1, including a memory controller configured to:
enable the sensor circuit during a program-verify mode of the memory device to provide an indication of current generated by the pump circuit after the pump circuit output reaches a program-verify target voltage;
re-buffer data received with a program command in response to detecting that the current generated by the pump circuit during the program-verify mode is greater than the specified threshold current; and
exclude an address for the program command from subsequent memory commands by the host device in response to the generated fault indication.

7. The memory device of claim 1, including a memory controller configured to:
cause the charge pump circuit to generate the program voltage target when the pump circuit is unconnected to a word line load;
determine a baseline count of the sensor circuit when the charge pump circuit output reaches the program voltage target while unconnected to the word line load; and
determine the specified threshold count using the baseline count.

8. The memory device of claim 7, wherein the logic circuitry is configured to determine when the current generated by the charge pump circuit is greater than a different specified threshold current when the program voltage target of the charge pump circuit is changed.

9. The memory device of claim 7, wherein the sensor circuit is configured to provide the indication of current generated by the charge pump circuit during a first program pulse prior to a program-verify operation.

10. A method of operating a memory device, the method comprising:
providing an indication of current generated by the pump circuit after the pump circuit output reaches the target voltage, wherein the indication of current is determined using a rate at which the pump circuit is activated during a specified timing window, wherein determining the rate at which the pump circuit is activated during a specified timing window includes starting a first counter to time a window of time, and a second counter to count the number of charge pump clocks that occur during the window of time when the charge pump is in steady state; and
determining when the indicated pump circuit current is greater than a specified threshold current, including pushing a second counter result to a memory controller to determine the second counter result indicates a defect or fault when the second counter result exceeds a threshold count during the window of time of the first counter, and
generating a fault indication according to the determination.

11. The method of claim 10, including the memory controller interrupting a current operation being performed by the memory controller and beginning a recovery sequence.

12. The method of claim 11, including:
writing data to multiple memory planes of memory cells of the memory device simultaneously during a write operation; and wherein the beginning the recovery sequence includes:
identifying, in response to determining that the current generated by the pump circuit is greater than the specified threshold current, a memory plane having a defect according to a number of failed bits of program-verify operations of the memory plane; and
including an indication of the identified memory plane in the fault indication communicated to the host device.

13. The method of claim 11, including:
writing data to multiple memory planes of memory cells of the memory device simultaneously during a write operation; and
wherein the beginning the recovery sequence includes:
identifying, in response to determining that the current generated by the pump circuit is greater than the specified threshold current, a memory plane having a defect according to a number of memory errors of the memory cell plane; and
including an indication of the identified memory plane in the fault indication communicated to the host device.

14. The method of claim 11, wherein the beginning the recovery sequence includes:
re-buffering data received with a program command in response to detecting that the current generated by the pump circuit during the program mode is greater than the specified threshold current; and
excluding an address for the program command from subsequent memory commands by the host device in response to the generated fault indication.

15. The method of claim 11, wherein the beginning the recovery sequence includes:
re-buffering data received with a program command in response to detecting that the current generated by the pump circuit during the program-verify mode is greater than the specified threshold current; and
excluding an address for the program command from subsequent memory commands by the host device in response to the generated fault indication.

16. An electronic system comprising:
an external device;
a memory device operatively coupled to the external device, the memory device including:
a memory array including memory cells;
a word line driver circuit including a charge pump circuit configured to generate a program voltage target to be applied to a word line to program a memory cell of the memory array; and
a control loop to activate the charge pump circuit using a control signal according to a comparison of a pump circuit output voltage to the program voltage target;
a current monitoring circuit configured to determine a rate at which the pump circuit is activated after the pump circuit output reaches the target voltage and provide an indication of current generated by the pump circuit using the determined rate after the charge pump circuit output reaches the program voltage target; and
a memory controller configured to:
enable the sensor circuit during a program mode of the memory device to provide an indication of current generated by the pump circuit after the pump circuit output reaches a program target voltage;
determine when the current generated by the pump circuit during the program mode is greater than a specified threshold current;
re-buffer data received with a program command in response to the determining that the current generated by the pump is greater than the specified threshold current
communicate a fault indication to the external device in response to the determination; and
exclude an address for the program command from subsequent memory commands by the host device in response to the generated fault indication.

17. The electronic system of claim 16, wherein the memory controller is configured to:
write data to multiple memory planes of memory cells of the memory device simultaneously during a write operation;
identify, in response to determining that the current generated by the pump circuit is greater than the specified threshold current, a memory plane having a defect according to a number of failed bits of program-verify operations of the memory plane; and
include an indication of the identified memory plane in the fault indication communicated to the external device.

18. The electronic system of claim 16, wherein the memory controller is configured to:
write data to multiple memory planes of memory cells of the memory device simultaneously during a write operation;
identify, in response to determining that the current generated by the pump circuit is greater than the specified threshold current, a memory plane having a defect according to a number of memory errors of the memory cell plane; and
include an indication of the identified memory plane in the fault indication communicated to the external device.

* * * * *